(12) United States Patent
Oh

(10) Patent No.: US 7,492,658 B2
(45) Date of Patent: Feb. 17, 2009

(54) APPARATUS AND METHOD FOR SELF-REFRESHING DYNAMIC RANDOM ACCESS MEMORY CELLS

(75) Inventor: HakJune Oh, Kanata (CA)

(73) Assignee: Mosaid Technologies Incorporated, Kanata, Ontario (CA)

( * ) Notice: Subject to any disclaimer, the term of this patent is extended or adjusted under 35 U.S.C. 154(b) by 0 days.

(21) Appl. No.: 11/930,292

(22) Filed: Oct. 31, 2007

(65) Prior Publication Data

US 2008/0056046 A1 Mar. 6, 2008

Related U.S. Application Data

(63) Continuation of application No. 11/319,451, filed on Dec. 29, 2005, now Pat. No. 7,362,640.

(51) Int. Cl.
*G11C 7/00* (2006.01)
(52) U.S. Cl. ............... 365/222; 365/210.1; 365/230.04; 365/189.07
(58) Field of Classification Search .................. 365/222, 365/210, 203, 207, 210.1, 230.04, 189.07
See application file for complete search history.

(56) References Cited

U.S. PATENT DOCUMENTS

| | | | | |
|---|---|---|---|---|
| 5,315,557 A * | 5/1994 | Kim et al. | .................... | 365/222 |
| 5,583,818 A | 12/1996 | You et al. | | |
| 5,903,511 A | 5/1999 | Gillingham | | |
| 6,449,182 B1 * | 9/2002 | Ooishi | ........................ | 365/63 |
| 6,449,204 B1 | 9/2002 | Arimoto et al. | | |
| 6,463,002 B2 | 10/2002 | Kim et al. | | |
| 7,158,433 B2 * | 1/2007 | Riho et al. | .................. | 365/222 |
| 2002/0118588 A1 | 8/2002 | Kato | | |
| 2004/0027902 A1 | 2/2004 | Ooishi et al. | | |
| 2005/0289294 A1 * | 12/2005 | Janzen | ........................ | 711/106 |

* cited by examiner

*Primary Examiner*—J. H. Hur
*Assistant Examiner*—Han Yang
(74) *Attorney, Agent, or Firm*—Shin Hung; Borden Ladner Gervais LLP

(57) ABSTRACT

A dynamic random access memory (DRAM) having DRAM cells coupled to wordlines and bitlines. In a self-refresh mode, the cells coupled with the even numbered rows retain main data previously stored therein and the assistant data, which is logically opposite to the main data, is overwritten into the cells coupled with the wordlines of the odd numbered rows. When the DRAM enters the self-refresh mode, a starting refresh address for the self-refresh mode is detected. If the detected starting refresh address does not match with a predetermined correct address set for the self-refresh operation mode, a dummy refresh cycle will be established in an entry-burst self-refresh period. During the dummy refresh cycle, a dummy refresh command is added to increment an internal row address counter that provides row addresses for self-refreshing the cells of the selected wordlines within the cell array.

22 Claims, 16 Drawing Sheets

APPARATUS AND METHOD FOR SELF-REFRESHING DYNAMIC RANDOM ACCESS MEMORY CELLS

RELATED APPLICATION

This application is a continuation of U.S. patent application Ser. No. 11/319,451 filed Dec. 29, 2005.

FIELD OF THE INVENTION

The present invention generally relates to a semiconductor integrated circuit. In particular, the present invention relates to a dynamic random access memory device with low power self-refresh operation.

BACKGROUND OF THE INVENTION

In dynamic random access memory (DRAM) integrated circuit devices, a DRAM cell array is typically arranged in rows and columns such that a particular DRAM cell is addressed by specifying its row and column within the array. A wordline connects a row of cells to a set of bitline sense amplifiers that detect the data in the cells. In a read operation, a subset of the data in the bitline sense amplifiers is then chosen, or "column-selected" for output. DRAM cells are "dynamic" in the sense that the stored data, typically in the form of charged and discharged storage capacitors, will dissipate after a relatively short period of time. Thus, in order to retain the information, the contents of the DRAM cells must be refreshed. The charged or discharged state of the storage capacitor must be reapplied to an individual memory cell in a repetitive manner. The maximum amount of time allowable between refreshing operations is determined by the charge storage capabilities of the storage capacitors that make up the DRAM cell array. DRAM manufacturers typically specify a refresh time for which data is retained in the DRAM cells.

A refresh operation is similar to a read operation, but no data is output. The sensing of the data in the cells by the bitline sense amplifiers is followed by a restoring operation that results in the data being rewritten to the cells. The data is, thus, "refreshed". The refresh operation is performed by enabling a wordline according to a row address, and enabling a bitline sense amplifier. In addition, the refresh operation may be carried out by operating the bitline sense amplifier without receiving an external refresh address. In this case, a refresh address counter, which is integrated in a DRAM device chip, generates a row address subsequent to receiving an external start address.

It is well known that data stored in memory cells of a DRAM is retained therein by refresh operations. A self-refresh operation is performed automatically in a "standby" mode to retain the data written in the memory cells of the DRAM. In known self-refresh operations, automatic burst refresh operations can be performed at the beginning of self-refresh and at the end of self-refresh operations for shortening a refresh regulation time and for securing a stable refresh of the memory cells. U.S. Pat. No. 5,583,818 granted to You et al. on Dec. 10, 1996 discloses a semiconductor memory device having an automatic burst refresh operation in a self-refresh operation.

A simplified description of prior art self-refresh operation is now discussed with reference to FIG. 1 that shows a self-refresh operation with automatic burst refresh function found in conventional DRAM devices. Referring to FIG. 1, in response to a command signal 111, a self-refresh mode detector 113 provides a self-refresh starting signal 115 at an entry into the self-refresh mode. A burst refresh mode controller 117 provides a burst refresh control signal 119 during a "burst self-refresh" period, in response to the self-refresh starting signal 115 and a clock signal 121 fed from a clock generator 123. A self-refresh mode controller 125 provides a self-refresh control signal 127, in response to the burst refresh control signal 119 and the self-refresh starting signal 115. The clock generator 123 provides the clock signal 121 and a self-refresh row signal 129, in response to the self-refresh control signal 127 and the burst refresh control signal 119. At an exit from the self-refresh mode, in response to the command signal 111, the self-refresh mode detector 113 ceases the self-refresh starting signal 115. Therefore, the self-refresh mode controller 125 ceases the generation of the self-refresh control signal 127. A period during the self-refresh control signal 127 being generated is a "self-refresh" period. Also, the burst refresh mode controller 117 provides the burst refresh control signal 119 during another "burst self-refresh" period. In response to the burst self-refresh control signal 119 and the self-refresh control signal 127, the clock generator 123 provides the self-refresh row signal 129 during the burst refresh period, the self-refresh period and the other burst self-refresh period. The self-refresh row signal 129 is provided to an internal row address counter which in turn provides a refresh row address signal to a row address decoder to refresh cells of the wordlines of sequentially selected rows.

The prior art DRAM device shown in FIG. 1 performs the self-refresh operation based on a one-cell-per-bit manner and the refresh of the DRAM cells has to be performed at a relatively high frequency. Therefore, the one-cell-per-bit self-refresh may still consume power during the self-refresh operation period. It is, thus, desirable to reduce power consumption in the self-refresh operation mode in the DRAM device.

SUMMARY OF THE INVENTION

It is an object of the present invention to provide an improved dynamic random access memory (DRAM) device having a cell array with a self-refresh function and an improved method for self-refreshing the DRAM cells with the array to reduce power consumption.

In accordance with one aspect of the present invention, there is provided a dynamic random access memory (DRAM) device including an array of DRAM cells of rows by columns. Each DRAM cell of the array is coupled with a wordline of a corresponding row and a bitline of a corresponding column. The DRAM device also includes a refresh circuit. With the refresh circuit, in a self-refresh mode, main data stored in the DRAM cells coupled with wordlines of a first set of every other rows is retained and assistant data is overwritten into the DRAM cells coupled with wordlines of a second set of every other rows. The assistant data is opposite data to the main data. Each row of the second set is adjacent to each row of the first set.

For example, the first and second sets of every other rows are the even and odd numbered rows, respectively. Thus, in the self-refresh mode, the DRAM cells coupled with the wordlines of the even numbered rows retain the main data therein and the assistant data is overwritten into the DRAM cells coupled with the wordlines of the odd numbered rows.

Advantageously, the refresh circuit includes a mode entry detection circuit that detects an entry into the self-refresh mode to retain the main data and to overwrite the assistant data. By the refresh circuit, a first self-refresh mode signal is produced. Also, the refresh circuit includes a dummy establishing circuit that detects a starting refresh address for operation of the self-refresh mode in response to the first self-refresh mode signal and that will establish a dummy refresh cycle if the detected starting refresh address mismatches with a predetermined address for operation of the self-refresh mode. The established dummy refresh cycle will be adopted for self-refreshing the DRAM cells.

Preferably, the refresh circuit further includes an entry signal producing circuit that produces a self-refresh entry signal in response to the first self-refresh mode signal. An adoption circuit adopts the dummy refresh cycle in the self-refresh mode. The adoption circuit may include a burst circuit that determines a first burst refresh cycle in response to the self-refresh entry signal.

Advantageously, in response to the self-refresh entry signal, the refresh circuit detects a starting refresh address for the self-refresh operation mode, from a refresh signal representing a refresh row address. In response to the self-refresh entry signal, a burst circuit determines a first burst refresh cycle. The dummy refresh cycle and the first burst refresh cycle are combined by the adoption circuit to establish an entry-burst refresh period.

If, for example, the DRAM cells coupled with the even numbered wordlines have to be refreshed, the automatic burst refresh cycle shall start with even numbered refresh address to perform the self-refreshing. In that case, the DRAM cells coupled with the odd numbered wordlines perform assistant roles. The refresh circuit detects the refresh row address corresponding to the even numbered wordline (i.e., a correct address), for example, based on the least significant bit (LSB) of the refresh row address. If the detected address does not match with the corresponding row address, that is a wrong address, a dummy refresh producer produces a dummy refresh pulse. Also, in response to the self-refresh mode entry, burst clock pulses and self-refresh oscillation pulses are produced. These pulses are combined by the cycle combining circuit to determine a dummy refresh cycle, a first burst refresh cycle and a self-refresh oscillation cycle as an entry-burst refresh period and a self-refresh period.

Preferably, the burst circuit includes a burst clock generator for generating pulses as the burst clock pulses and also includes a pulse counter for counting the burst clock pulses until a predetermined value (N). For example, the predetermined value relates to the number (N) of the wordlines associated with the array. Upon N count, a second self-refresh mode signal is produced by the pulse counter. The generation of the second self-refresh mode signal results in the end of the first burst refresh cycle. In response to the second self-refresh mode signal, an oscillation circuit generates the pulses of the self-refresh oscillation pulses to start the self-refresh oscillation cycle.

For example, at the exit from the self-refresh mode, the self-refresh control circuit produces a self-refresh exit signal. The first self-refresh mode signal is disabled. In response to the self-refresh exit signal, the generation of the self-refresh oscillation pulses is ceased and again, the burst refresh clock signal having pulses of the predetermined number N is generated. With the first self-refresh mode signal being disabled, the self-refresh oscillation cycle ends. The burst refresh clock pulses are combined by the cycle combining circuit to determine a second burst refresh cycle as an exit-burst refresh period.

Advantageously, the cycle of the generation of the burst refresh pulses at each of the entry into and the exit from the self-refresh mode is determined based on the number of the wordlines (or rows) of the DRAM cell array. Advantageously, the pulse counter counts the pulses of the burst refresh clock signal up to N which is consistent with the number of the wordlines. Upon N count, the second self-refresh mode signal is produced by the pulse counter. The second self-refresh mode signal is used for disabling the self-refresh entry and exit signals.

An embodiment DRAM device includes the circuitry of the designated address detection and the dummy refresh cycle generation for the self-refresh operation mode. In a case where the DRAM cells of the even numbered wordlines are set to maintain their stored data in the self-refresh operation settings, the self-refresh mode enters with the initial burst refresh cycle starting at the even numbered wordline. There is, therefore, provided the detection of the starting refresh address and the adoption of a dummy refresh cycle in a case where the detected refresh address does not match with the self-refresh operation setting, to perform an automatic burst refresh operation at the beginning of the self-refresh. The detection of the starting refresh address is based on a specific bit (e.g., the LSB) of the refresh row address.

In accordance with another aspect of the present invention, there is provided a method for self-refreshing a DRAM having cells of an array of rows by columns. Each DRAM cell of the array is coupled with a wordline of a corresponding row and a bitline of a corresponding column. By the method, the DRAM cells coupled with wordlines of a first set of every other rows retain main data stored therein and assistant data, which is opposite data to the main data, is overwritten into the DRAM cells coupled with wordlines of a second set of every other rows, in a self-refresh mode.

Preferably, an entry into the self-refresh mode to retain the main data and to overwrite the assistant data is detected and a first self-refresh mode signal is produced. In response to the first self-refresh mode signal, a starting refresh address for operation of the self-refresh mode is detected. If the detected starting refresh address does not match with a predetermined address for operation of the self-refresh mode, the established dummy refresh cycle will be established and be adopted for self-refreshing the DRAM cells.

Advantageously, the step of retaining includes rewriting the main data in the DRAM cells coupled with the wordlines of the even numbered rows and the step of overwriting includes rewriting the assistant data in the DRAM cells coupled with the wordlines of the odd numbered rows.

In accordance with embodiments of the present invention, there are provided an appropriate and practical design of and an appropriate method for self-refresh control to reduce power consumption of DRAM devices.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

In the following detailed description of sample embodiments of the invention, reference is made to the accompanying drawings which form a part hereof, and in which is shown by way of illustration specific sample embodiments in which the present invention may be practiced. These embodiments are described in sufficient detail to enable those skilled in the art to practice the present invention, and it is to be understood that other embodiments may be utilized and that logical, mechanical, electrical, and other changes may be made without departing from the scope of the present invention. The following detailed description is, therefore, not to be taken in a limiting sense, and the scope of the present invention is defined by the appended claims.

Generally, the present invention provides the self-refreshing of memory cells within an array included in a dynamic random access memory (DRAM) device.

Figure 1:
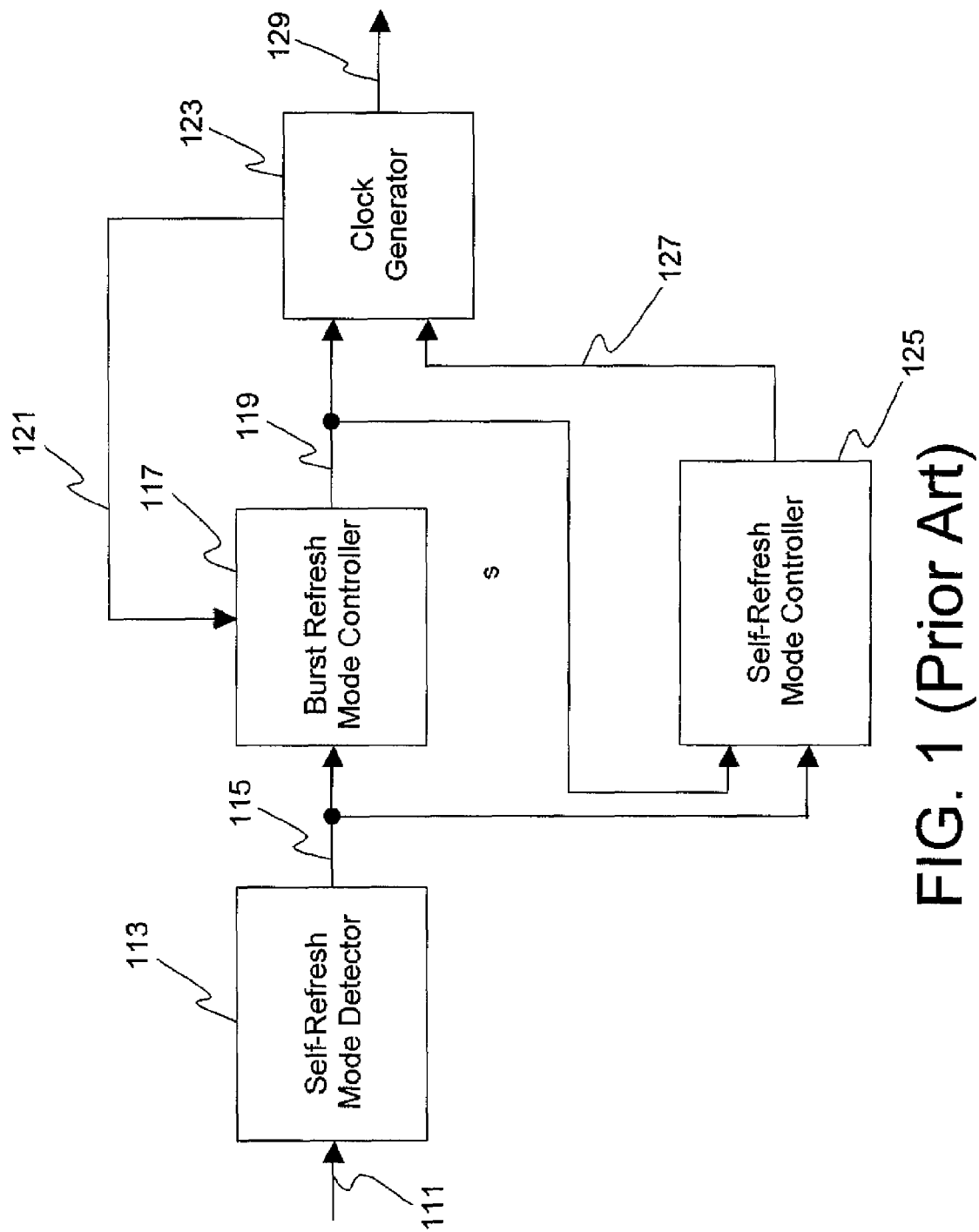
FIG. 1 is a block diagram illustrating self-refresh operation with automatic burst refresh function found in conventional dynamic random access memory (DRAM) devices.

As previously described, the prior art DRAM device shown in FIG. 1 performs the self-refresh operation based on the one-cell-per-bit manner during the self-refresh period. Therefore, the self-refresh operation needs only burst refresh control in response to the entry into and/or the exit from the self-refresh mode.

If a DRAM device implements the self-refresh function based on a two-cell-per-bit manner, data of one half of cells (e.g., of the even numbered wordlines) will be stored as main data and opposite data of the other half of cells (e.g., of the odd numbered wordlines) will be stored as assistant data. However, without circuitry for performing correct row addressing, the two-cell-per-bit self-refresh may be performed improperly.

It is assumed that the DRAM device implements the self-refresh function based on the two-cell-per-bit manner and that the even numbered wordlines (WL0, WL2, WL4, . . . ) control the bitline data and the odd numbered wordlines (WL1, WL3, . . . ) control the complementary bitline data. The cell data of the even numbered wordline is preferably retained in accordance with the two-cell-per-bit self-refresh operation settings. The cells of all odd numbered wordlines preferably store the specific opposite data to those of the corresponding even numbered wordlines. In a case wherein the DRAM device enters the self-refresh operation mode, only data of one half of the memory cells (e.g., of the even numbered wordlines) is retained and the other half of memory cells (e.g., of the odd numbered wordlines) store the opposite or complementary data.

For example, if a cell of wordline WL0 has data "high", the corresponding cell of wordline WL1 should be written with opposite data "low" (i.e., the assistant data). The data of the pair of cells connected to wordlines WL0 and WL1 is fed to a bitline sense amplifier. Wordline WL0 is activated and the data stored in the cells thereof is restored by a refresh command. Then, wordline WL1 is activated, while wordline WL0 is still active, the complementary bitline data overwrites the cells of wordline WL1, that is, the opposite data is written into the cells of wordline WL1. This procedure has to be done for all other wordlines in the cell array for the two-cell-per-bit manner of operation.

The two-cell-per-bit self-refresh operation mode should enter with the initial burst refresh cycle starting with the even numbered wordline, if the even numbered wordlines are set in the address setting as such that the main data is maintained in the cells thereof. Similarly, if the odd numbered wordlines are set in the address setting as such that the main data is maintained in the cells thereof, the self-refresh operation mode should enter with the initial burst refresh cycle starting at the odd numbered wordline. This ensures that the data is retained upon return to the one-cell-per-bit manner of operation. It, therefore, requires self-refresh circuitry for performing automatic burst refresh and the detection of a correct start refresh address.

The embodiments in accordance with the present invention are now described in the context of a DRAM device, and in particular, a refresh controller for self-refreshing DRAM cells within an array.

Figure 2:
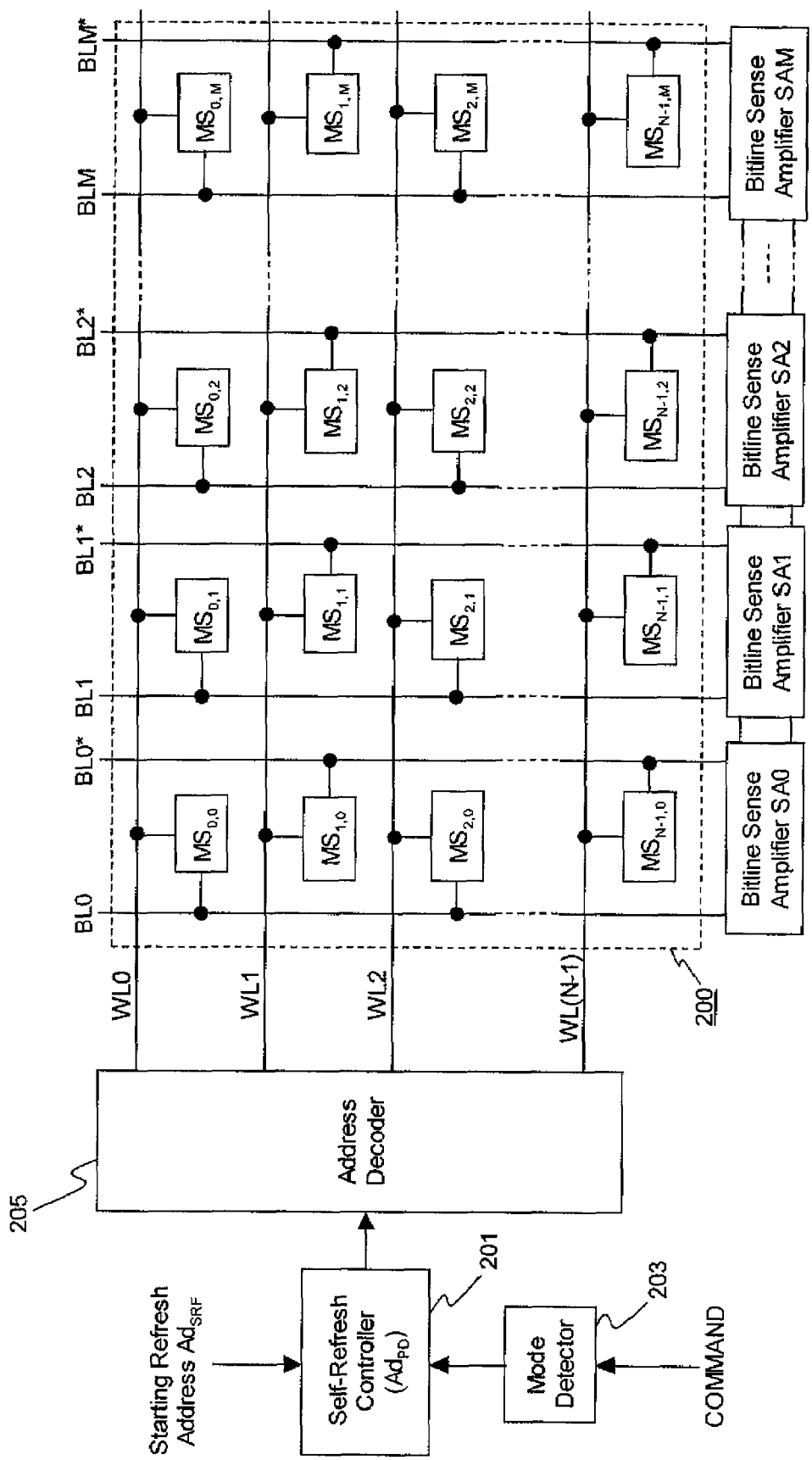
FIG. 2 illustrates a DRAM device with a self-refresh function according to an embodiment of the present invention.

FIG. 2 shows a DRAM device according to an embodiment of the present invention. Referring to FIG. 2, an array 200 of DRAM cells has a plurality of wordlines WL0-WL(N−1) and a plurality of bitlines BL0 and BL0\* - - - BLM and BLM\*. The array 200 of N rows by (M+1) columns includes a plurality of DRAM cells MS (i.e., $MS_{0,0}$ to $MS_{N-1,M}$) that are to be refreshed. Each DRAM cell includes an access transistor and a charge storage capacitor (not shown). A plurality of bitline sense amplifiers SA0-SAM are coupled with the array 200. The bitlines are arranged as folded bitlines (pairs of complementary bitlines) and each complementary bitline pair of BL0, BL0\* - - - BLM, BLM\* are connected to a corresponding bitline sense amplifier. The bitline sense amplifiers SA0-SAM are connected to databuses (not shown) through a pair of respective column access transistors (not shown). The pairs of column access transistors are activated by respective column address signals, when data access to the array 200 is required.

In the array 200 of DRAM cells, the refresh row address signal is represented by (n+1) bit signal, RFA(0:n), for example. Each of the memory cells is coupled with associated wordline and one bitline of a complementary bitline pair. Data can be read through the bitline sense amplifier connected to the respective complementary bitline pair. In a read operation, a wordline is activated and the bit charge is shared with the associated bitline. In accordance with the column address, the full logic level on the bitlines is applied to the databuses. The cells of the array 200 are refreshed in the self-refresh operation mode. In the two-cell-per-bit self-refresh mode, the previously stored data, i.e., main data, in the cells of the even numbered rows are retained and the assistant data, which is opposite to the main data, overwrites the cells of the odd numbered rows.

The refreshing operation of the DRAM cells of the array 200 is performed by a self-refresh controller 201 and a mode detector 203 that detects an entry into and an exit from the self-refresh mode in response to COMMAND signal. Based on the detected self-refresh entry and exit, a time period between the self-refresh entry and exit is determined. The self-refresh controller 201 receives a starting refresh address $Ad_{SRF}$ included in a row address and compares it to a predetermined address $Ad_{PD}$. If the detected starting refresh address $Ad_{SRF}$ and the predetermined address $Ad_{PD}$ mismatch with each other, the self-refresh controller 201 will establish a dummy refresh cycle. The dummy refresh cycle is adopted during the time period between the self-refresh entry and exit and the starting refresh address is changed. Based on the changed starting refresh address, proper row addresses are provided by an address decoder 205 to drive the wordlines. In response to the row addresses, the two-cell-per-bit self-refresh operation is performed to refresh the DRAM cells within the array 200.

If the detected starting refresh address $Ad_{SRF}$ matches with the predetermined address $Ad_{PD}$, the self-refresh controller 201 will provide no dummy refresh cycle. Thus, without change to the detected starting refresh address, the non-changed refresh starting address is provided by the address decoder 205 to perform the two-cell-per-bit self-refresh of the DRAM cells within the array 200.

Figure 3:
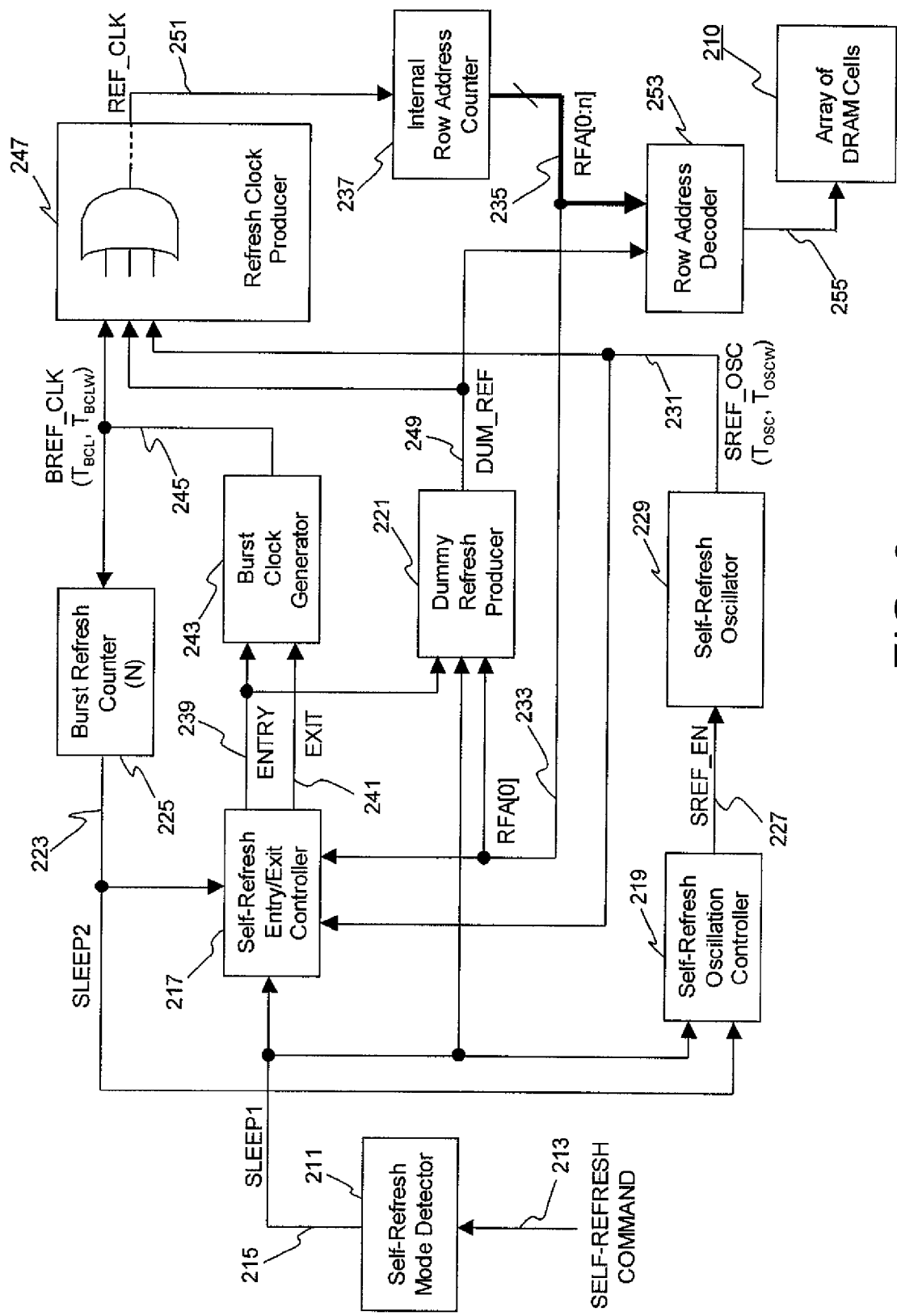
FIG. 3 is a block diagram of a DRAM device according to one embodiment of the present invention.

FIG. 3 shows a DRAM device according to one embodiment of the present invention. An array 210 of DRAM cells included in the DRAM device is associated with a plurality of wordlines, a plurality of bitlines and includes a plurality of memory cells. Each memory cell is coupled with associated wordline and bitline. The array 210 of DRAM cells of N rows by (M+1) columns and bitline sense amplifiers are arranged as the array 200 shown in FIG. 2. The DRAM cells of the array 210 operate with high and low supply voltages VDD and VSS (voltage sources not shown) that correspond to "high" and "low" logic states.

Referring to FIG. 3, an operation of the self-refresh mode, known as a "sleep" mode, is initiated by issuing a self-refresh entry command. A self-refresh mode detector 211 receives a self-refresh command signal 213 provided by a memory controller (not shown) and provides a first sleep signal "SLEEP1" 215 to a self-refresh entry/exit controller 217, a self-refresh oscillation controller 219 and a dummy refresh producer 221. In response to the first sleep signal 215 and a second sleep signal "SLEEP2" 223 from a burst refresh counter 225, the self-refresh oscillation controller 219 provides a self-refresh oscillation enable signal "SREF_EN" 227 to a self-refresh oscillator 229 which in turn provides a self-refresh oscillation signal "SREF_OSC" 231 to the self-refresh entry/exit controller 217.

The self-refresh entry/exit controller 217 receives the first sleep signal 215, the second sleep signal 223, the self-refresh oscillation signal 231 and a one-bit address signal 233 representing the least significant bit (LSB) "RFA[0]" of a refresh row address signal 235. The refresh row address signal 235 is provided by an internal row address counter 237 and represents (n+1) bit address RFA[0:n]. The self-refresh entry/exit controller 217 provides a self-refresh entry signal "ENTRY" 239 and a self-refresh exit signal "EXIT" 241 to a burst clock generator 243 which in turn provides a burst refresh clock signal "BREF_CLK" 245 to the burst refresh counter 225 and a refresh clock producer 247.

The dummy refresh producer 221 responds to the self-refresh entry signal 239, the first sleep signal 215 and the address LSB signal 233 and provides a dummy refresh signal "DUM_REF" 249 to the refresh clock producer 247. The refresh clock producer 247 performs control functions of producing pulses as a refresh clock signal "REF_CLK" 251. In the present embodiment, the clock producer 247 effectively functions as an OR circuit to logically combine the burst refresh clock signal 245, the dummy refresh signal 249 and the self-refresh oscillation signal 231, so that the logically combined refresh clock signal "REF_CLK" 251 is provided to the internal row address counter 237. The internal row address counter 237 counts the pulses of the refresh clock signal 251 to provide the refresh row address signal "RFA[0:n]" 235. A row address decoder 253 receives the refresh row address signal 235 and the dummy refresh signal "DUM_REF" 249 and provides a decoded row address signal 255 to the array 210 of DRAM cells. In response to the dummy refresh cycle being established or non-established, proper decoding addresses are provided by the row address decoder 253 to activate the selected wordlines of the cell array arranged as shown in FIG. 2 for the purpose of refreshing the cells. In a case where a dummy refresh pulse in the dummy refresh signal 249 is produced and a dummy cycle is established, the row address decoder 253 ignores the address provided by the internal row address counter 237 during the established dummy cycle.

The pulses of the burst refresh clock signal 245 generated by the burst clock generator 243 are counted by the burst refresh counter 225. The burst refresh counter 225 provides the second sleep signal 223 when its count reaches N.

Figure 4:
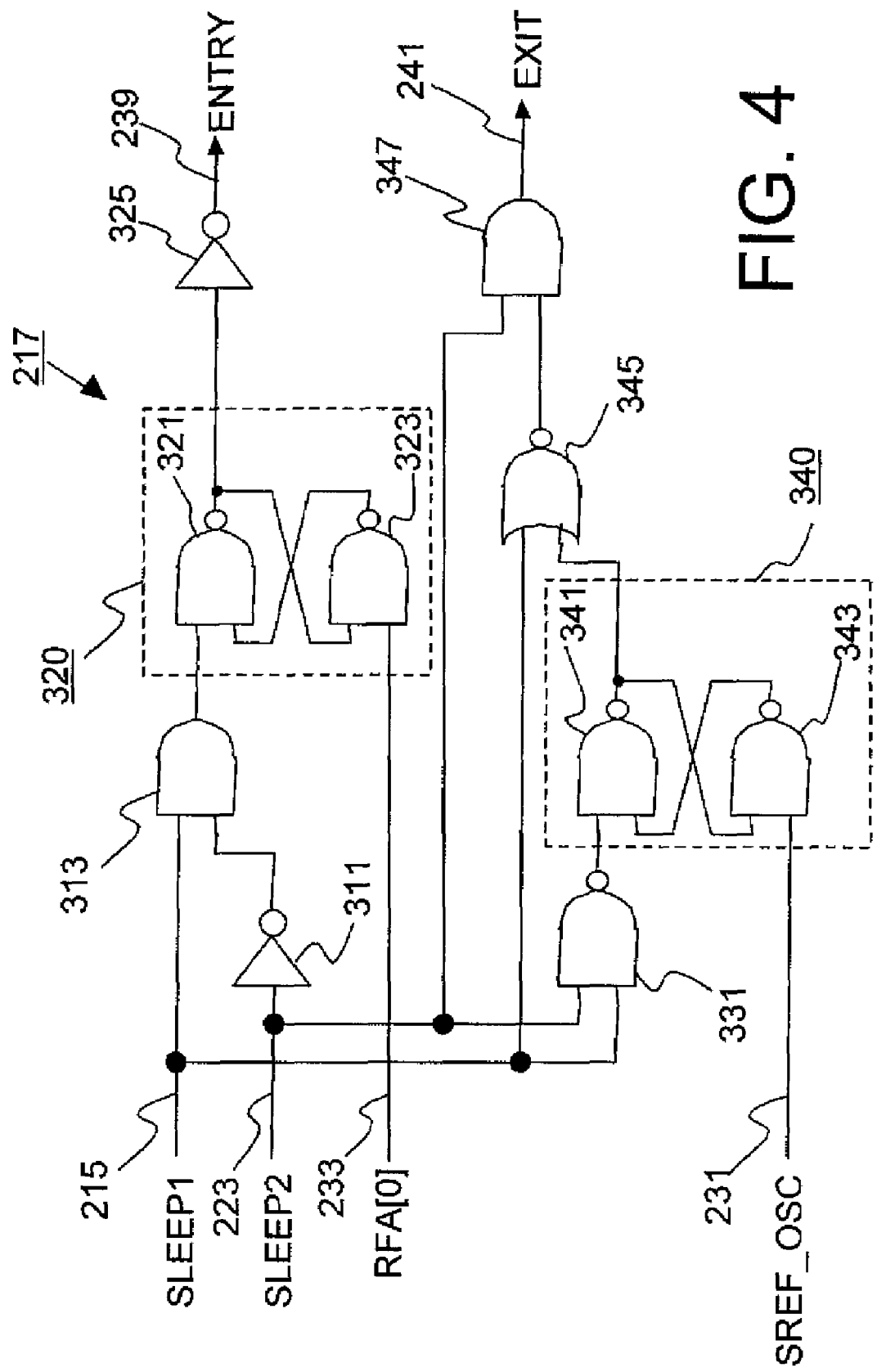
FIG. 4 is a block diagram illustrating an example of a self-refresh entry/exit controller of the DRAM device shown in FIG. 3.

FIG. 4 shows a detailed circuit of the self-refresh entry/exit controller 217 shown in FIG. 3. Referring to FIG. 4, the second sleep signal 223 is inverted by an inverter 311. The inverted output signal from the inverter 311 and the first sleep signal 215 are fed to an AND gate 313. An output signal of the AND gate 313 and the address LSB signal "RFA[0]" 233 are fed to an R-S flip-flop type latch circuit 320 including cross-coupled NAND gates 321 and 323. An output signal of the latch circuit 320 (i.e., the NAND gate 321) is inverted by an inverter 325 to produce the self-refresh entry signal 239. Also, the first sleep signal 215 and the second sleep signal 223 are fed to a NAND gate 331. An output signal of the NAND gate 331 and the self-refresh oscillation signal 231 are fed to another R-S flip-flop type latch circuit 340 including cross-coupled NAND gates 341 and 343. An output signal of the latch circuit 340 (i.e., the NAND gate 341) and the first sleep signal 215 are fed to a NOR gate 345. An output signal of the NOR gate 345 and the second sleep signal 223 are fed to an AND gate 347 which in turn provides the self-refresh exit signal 241.

Figure 5:
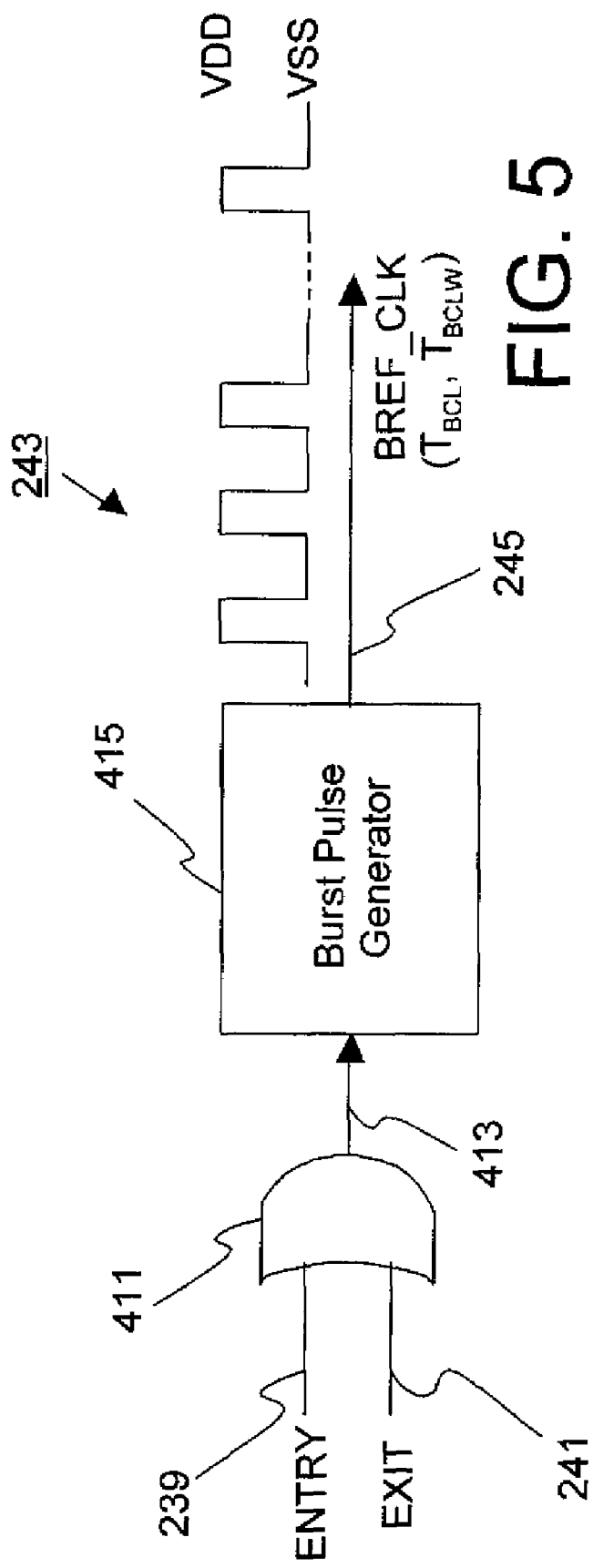
FIG. 5 is a block diagram illustrating an example of a burst clock generator of the DRAM device shown in FIG. 3.

FIG. 5 shows a detailed circuit of the burst clock generator 243 shown in FIG. 3. Referring to FIG. 5, the self-refresh entry signal 239 and the self-refresh exit signal 241 are fed to an OR gate 411 which in turn provides a pulse control signal 413 to a burst pulse generator 415. During the "high" logic state of the pulse control signal 413, the burst pulse generator 415 generates pulses continuously as the burst refresh clock signal 245, the pulse having a predetermined repetition period $T_{BCL}$ and pulse width $T_{BCLW}$.

Figure 6:
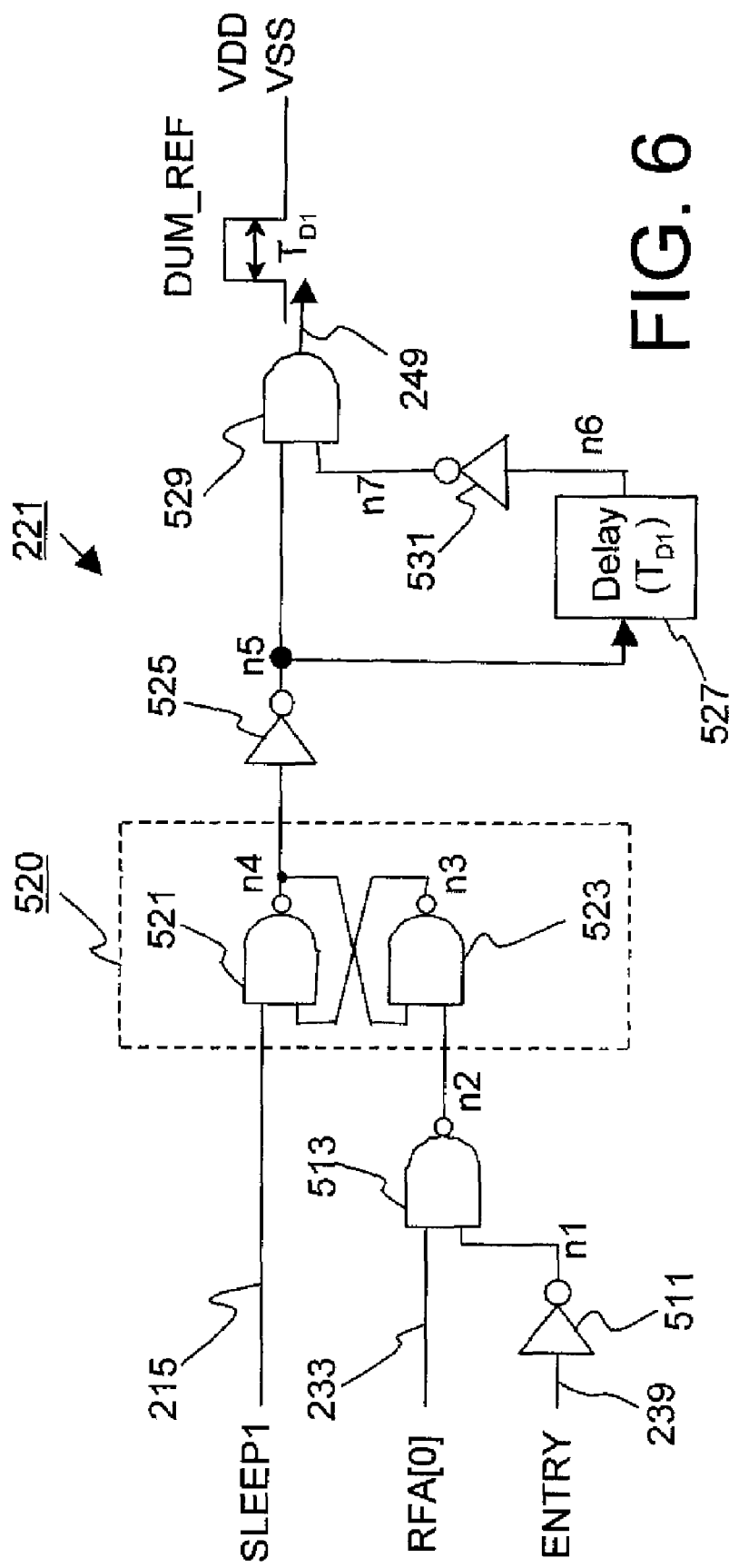
FIG. 6 is a block diagram illustrating an example of a dummy refresh producer of the DRAM device shown in FIG. 3.

FIG. 6 shows a detailed circuit of the dummy refresh producer 221 shown in FIG. 3. Referring to FIG. 6, the self-refresh entry signal 239 is inverted by an inverter 511. The inverted output signal n1 of the inverter 511 and the address LSB signal "RFA[0]" 233 are fed to a NAND gate 513. An output signal n2 of the NAND gate 513 and the first sleep signal 215 are fed to an R-S flip-flop type latch circuit 520 including cross-coupled NAND gates 521 and 523. The latch circuit 520 receives the first sleep signal 215 and the NAND output signal n2. The NAND gates 523 and 521 provide output signals n3 and n4, respectively. The output signal n4 of the NAND gate 521 of the latch circuit 520 is inverted by an inverter 525, the inverted output signal n5 of which is fed to a delay circuit 527 having a delay time $T_{D1}$ and to an AND gate 529. An output signal n6 of the delay circuit 527 is inverted by an inverter 531, the inverted output signal n7 of which is fed to the AND gate 529. The AND gate 529 produces the dummy refresh signal 249 that has a pulse, the width of which corresponds to the delay time $T_{D1}$ of the delay circuit 527.

Figure 7:
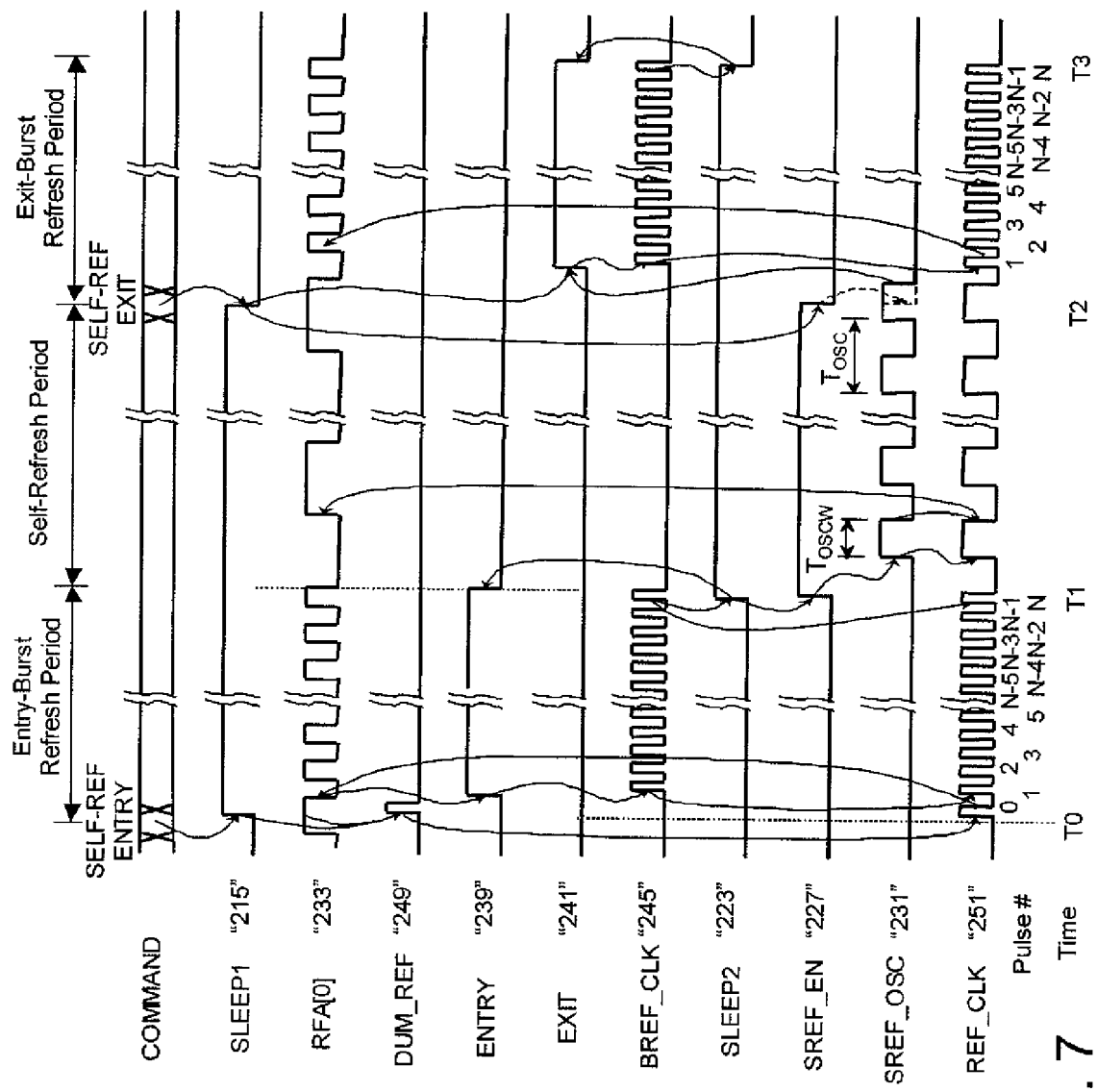
FIG. 7 is a timing diagram illustrating relative timing sequence for the signals of the DRAM device shown in FIG. 3.
Figure 8:
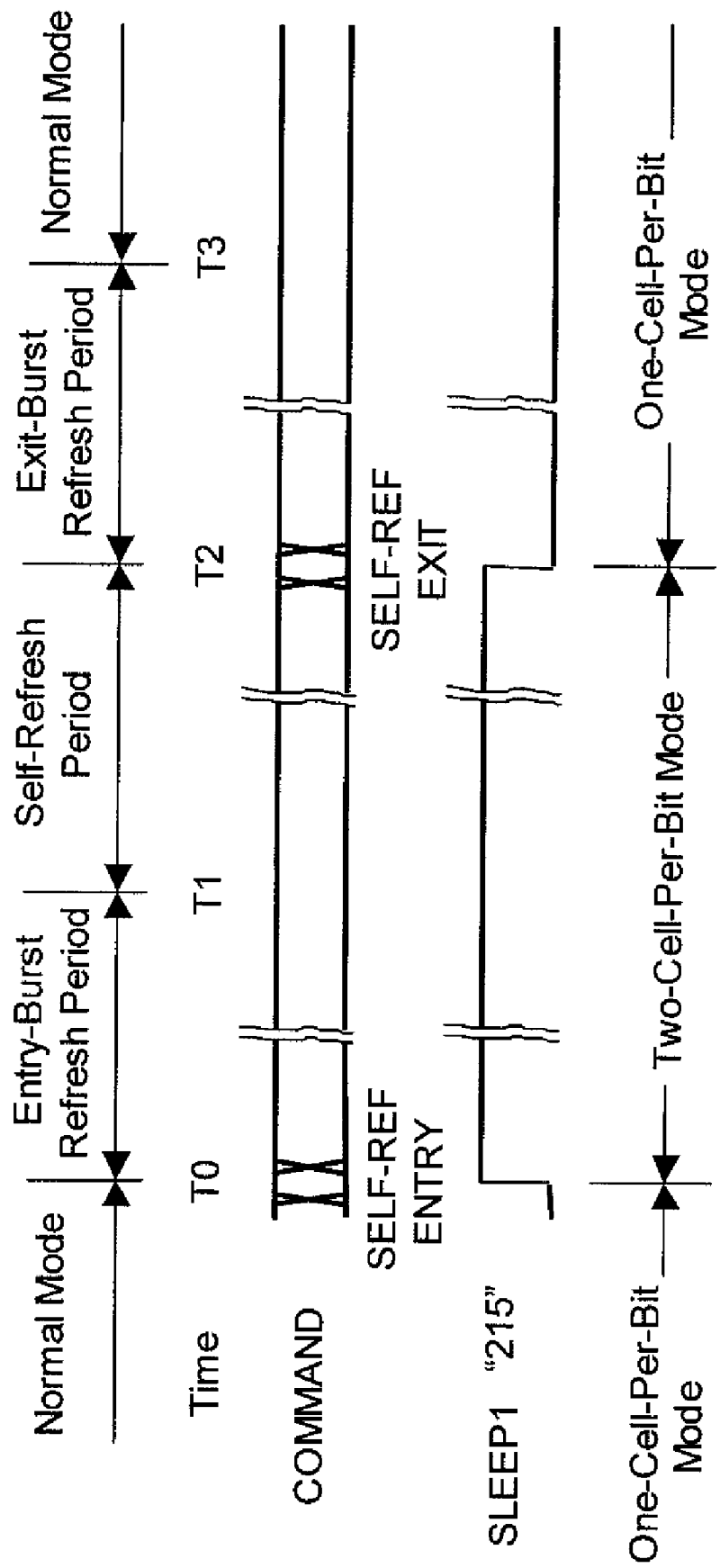
FIG. 8 illustrates operation modes in the DRAM device shown in FIG. 3.
Figure 9:
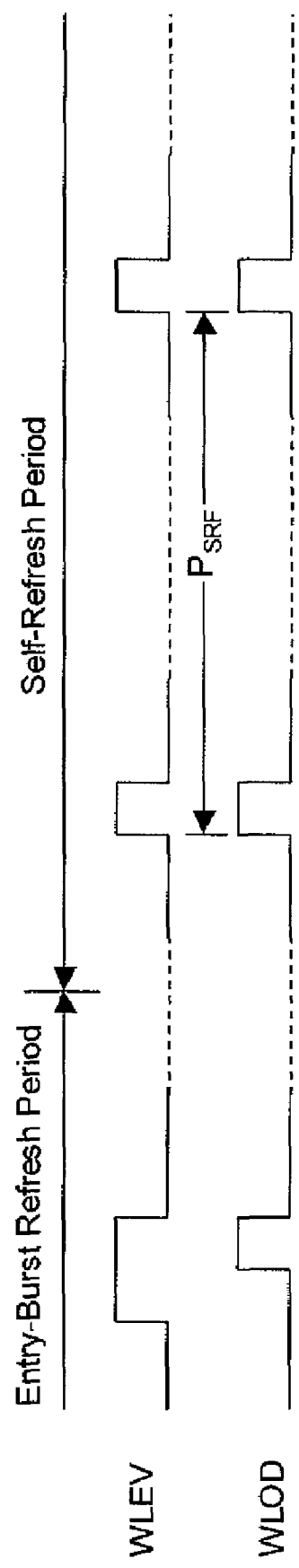
FIG. 9 illustrates timing of activating wordlines of even and odd numbered row addresses.
Figure 10:
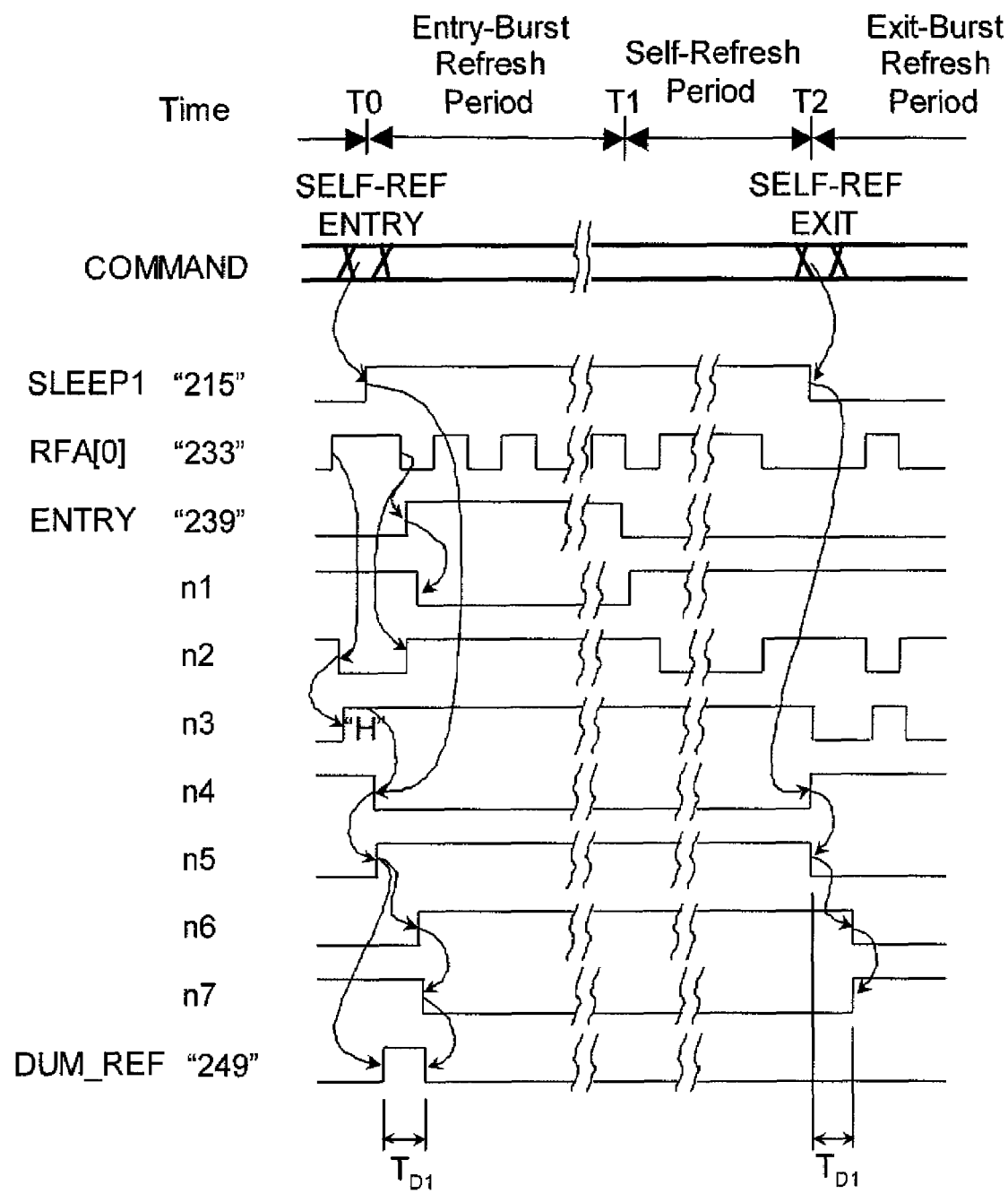
FIG. 10 is a timing diagram illustrating relative timing sequence for the signals of the dummy refresh producer shown in FIG. 6.

FIG. 7 shows relative timing sequence for the signals of the DRAM device shown in FIG. 3. FIG. 8 shows the operations in the self-refresh mode by the DRAM device shown in FIG. 3. FIG. 9 shows the activation of wordlines of even and odd numbered row addresses. FIG. 10 shows relative timing sequence for the signals of a dummy refresh producer shown in FIG. 6.

Referring to FIGS. 2-10, the operations of the embodiment DRAM device will be now described. The array 210 of DRAM cells is operated with the two-cell-per-bit addressing manner and the cells can be refreshed in the self-refresh mode. Before the operation mode enters the two-cell-per-bit self-refresh mode, the operation mode is the normal one-cell-per-bit mode. For the DRAM cell array, the starting refresh address at the entry-burst refresh period should match with the selected row address which is either an even or an odd numbered address. The DRAM device includes circuitry for detecting the starting refresh address at the self-refresh entry and for providing addresses in response to the detected starting refresh address for self-refreshing the DRAM cells.

In the embodiment, signals are active "high" logic. Each signal has "high" and "low" logic states corresponding to the high and low supply voltages VDD and VSS, respectively (voltage supply circuitry not shown). At the self-refresh entry (i.e., an entry into the two-cell-per-bit self-refresh mode), in response to the self-refresh command signal 213, the self-refresh mode detector 211 enables the first sleep signal "SLEEP1" 215 (time T0). After the first sleep signal 215 goes "high" in response to the self-refresh entry, the self-refresh entry/exit controller 217 starts detecting whether or not the logic state of the address LSB signal "RFA[0]" 233 is "high". In the embodiment, only the LSB of the row address, RFA[0], is detected. For the present example, the cells of the even numbered wordlines are to be refreshed in the self-refresh operation. Therefore, the LSB (i.e., RFA[0]) must be at the "low" logic state at the beginning of the self-refresh operation mode, so that the even numbered wordlines are refreshed first in the burst refresh operation. Thus, in the DRAM cell array, the LSB's logic state of the row address is detected and it is decided whether the detected logic state matches with the predetermined (or set) logic state of the starting row address.

In a case where the LSB (one-bit "RFA[0]) is "high" when the first sleep signal 215 goes "high" at time T0, that is, no match between the LSB with the predetermined logic state "low" (i.e., a "wrong" address detected), the dummy refresh producer 221 generates a pulse as the dummy refresh signal 249. Upon receipt of the pulse of the dummy refresh signal 249, the refresh clock producer 247 generates a pulse as the refresh clock signal 251 (pulse #0), so as that the internal row address counter 237 changes its count. Then, in response to the falling transition of pulse #0, the internal row address counter 237 toggles its appropriate counters therein (not shown), with the result that the address LSB signal "RFA[0]" 233 changes its logic state from "high" to "low". Thus, the one-bit address "RFA[0]" is changed to the logic state of a "correct" address bit. The dummy pulse, which corresponds to pulse #0, is not fed to the burst refresh counter 225 and thus, it does not count the dummy pulse.

In order to detect the "RFA[0]" state of the address LSB signal 233, the latch circuit 520 is used in the dummy refresh producer 221. Before time T0, as the logic state of the self-refresh entry signal "ENTRY" 239 is "low", in response to the rising transition of the address LSB signal 233, the output signal n2 of the NAND gate 513 of the dummy refresh producer 221 goes "low" and the output signal n3 of the NAND gate 523 of the latch circuit 520 goes "high". In response to the rising transition of the first sleep signal 215, the NAND output signal n4 of the latch circuit 520 goes "low", with the result that the inverted output signal n5 of the inverter 525 goes "high". As such, upon detection of the bit of "RFA[0]" being logic "high" when the first sleep signal 215 goes "high", the generation of the pulse of the dummy refresh signal 249 is initiated. The delay circuit 527 and the inverter 531 are used for generation of a pulse signal having a self-timed width TD1. The generation of the pulse of the dummy refresh signal 249 establishes a dummy refresh cycle.

As described above, at the self-refresh entry, the first sleep signal "SLEEP1" 215 goes "high" (time T0). As shown in FIG. 7, the logic state of the address LSB signal "RFA[0]" 233 is "high" at time T0. The falling transition of the first sleep signal 215 does not cause the "high" logic state of the output of the latch circuit 320 to change. Thus, the self-refresh entry "ENTRY" 239 maintains the "low" logic state. Once the address LSB signal "RFA[0]" 233 changes its logic state from "high" to "low", the output of the NAND gate 321 of the latch circuit 320 goes "low", with the result that the self-refresh entry/exit controller 217 enables the self-refresh entry signal 239 to transition from the "low" logic state to the "high" logic state. Then, the burst clock generator 243 that includes the burst pulse generator 415 therein starts to operate. The burst clock generator 243 commences the generation of the burst refresh clock signal 245 having continuous narrow clock pulses that are provided to the refresh clock producer 247 and the burst refresh counter 225. The refresh clock producer 247 produces the refresh clock signal 251. In response to the falling transitions of the refresh clock signal 251, the internal row address counter 237 toggles the address LSB signal 233. Hence, in a case of the "high" logic state of the address LSB signal "RFA[0]" 233 at the self-refresh entry, the enabling of the self-refresh entry signal "ENTRY" 239 and the generation of the burst refresh clock pulses of the burst refresh clock signal "BREF_CLK" 245 are delayed until the expiration of the established dummy refresh cycle.

The burst refresh counter 225 counts the pulses (which correspond to pulses #1, #2, - - - ) of the burst refresh clock signal 245. When the count reaches N, it produces the second sleep signal 223. The second sleep signal 223 is enabled and transitions from the "low" to "high" logic state at time T1. Wherein, N is the number of the wordlines of the array 210 of DRAM cells. The rising transition of the second sleep signal 223 disables the self-refresh entry signal 239, so that the burst clock generator 243 ceases the generation of the burst refresh clock signal 245. Thus, the generation of pulses of the refresh clock signal 251 is ceased at time T1. The generation and ceasing of pulses of the burst refresh clock signal 245 establish a burst refresh cycle. The first burst operation from time T0 to time T1 (i.e., a combination of the dummy refresh cycle and the burst refresh cycle) is called an "entry-burst refresh period". The row address decoder 253 receives the refresh row address signal 235 that corresponds to pulses #0-#N of the refresh clock signal "REF_CLK" 251. In response to the dummy refresh signal 249, during the established dummy refresh cycle, the row address decoder 253 disregards the refresh row address derived from pulse #0 and decodes the self decoded row addresses derived from pulses #1-#N of the refresh clock signal 251 to provide the decoded row address signal 255. The decoded row address signal 255 is used for selecting one or more wordlines of the array 210 of DRAM cells. The cells of the selected wordlines are refreshed. However, the settings for the DRAM cell array in the embodiment DRAM device are such that the cells of the even numbered wordlines, as the main behaving cells, are to be refreshed and the data is retained therein.

During the entry-burst refresh period, the even numbered wordline WLEV (e.g., wordline WL0) is activated and the cells ($MS_{0,0}$ to $MS_{0,M}$) connected thereto are refreshed, so that the cells are restored by the previously stored data bit. While the activated even numbered wordline WLEV is still active, its adjacent and odd numbered wordline WLOD (e.g., wordline WL1) is activated (see FIG. 9) and the cells ($MS_{1,0}$ to $MS_{1,M}$) connected thereto are overwritten by the opposite data bit to that of the even numbered cells.

When the second sleep signal 223 goes "high", its rising transition from the "low" to "high" logic state activates the self-refresh oscillation controller 219. The self-refresh oscillation enable signal 227 is enabled and transitions from the "low" logic state to the "high" logic state. Also, the self-refresh entry signal "ENTRY" 239 is disabled. In response to the rising transition of the self-refresh oscillation enable signal 227, the self-refresh oscillator 229 commences the generation of the self-refresh oscillation signal 231 having continuous pulses. The pulse repetition period $T_{OSC}$ and the pulse width $T_{OSCW}$ of the self-refresh oscillation signal 231 are predetermined. The pulse repetition period $T_{OSC}$ of the self-refresh oscillation signal 231 is selected to be much longer than that of the burst refresh clock signal 245. After time T1, the DRAM cell array is in a real "self-refresh" mode or so called as "sleep" mode for a certain period of time ("self-refresh period") to reduce power consumption until the "self-refresh exit" command is given by the memory controller at time T2 (i.e., an exit from the self-refresh operation mode).

If the logic state of the address LSB signal "RFA[0]" 233 is "low" when the first sleep signal "SLEEP1" 215 transitions from the "low" to the "high" logic state at time T0, that is, the detected LSB of the refresh row address matches with the predetermined logic state of "low", the detected starting address will be "correct". In the situation of the correct address detection, as the output signal n3 of the NAND gates 523 of the latch circuit 520 is "low", despite the rising transition of the first sleep signal 215, the output signal n4 of the NAND gate 521 maintains its "low" logic state. No pulse is produced as the dummy refresh signal 249 and thus, no dummy refresh cycle is established.

In response to the "self-refresh exit" command by the self-refresh command signal 213, the self-refresh mode detector 211 disables the first sleep signal 215 and thus, the first sleep signal 215 transitions from the "high" to "low" logic state (time T2). The falling transition of the first sleep signal 215 causes the output signal n4 of the NAND gate 521 to transition from the "low" to "high" logic state. The inverted output signal n5 of the inverter 525 transitions from the "high" to "low" logic state and thus, no pulse of the dummy refresh signal 249 is produced. No dummy refresh cycle is established at the exit from the self-refresh mode.

In response to the falling transition of the first sleep signal 215, the self-refresh oscillation controller 219 disables the self-refresh oscillation enable signal 227 and it transitions from the "high" to "low" logic state. Therefore, the self-refresh oscillator 229 ceases the generation of pulses of the self-refresh oscillation signal 231. The generation and ceasing of pulses of the self-refresh oscillation signal 231 establishes a self-refresh cycle or a self-refresh period. In this self-refresh period, the decoded row address signal 255 represents row addresses for selecting wordlines of the array 210, as described above.

As described above, during the entry-burst refresh period, the cells connected to the even numbered wordlines are refreshed and retain the main data. The cells connected to the odd numbered wordlines are overwritten by the opposite data. Therefore, two cells (e.g., cells $MS_{0,0}$ and $MS_{1,0}$) connected to a pair of even and odd numbered wordlines (e.g., WL0 and WL1) store one bit of data with a large voltage difference by the two differential voltage levels therebetween. During the self-refresh period, the main and assistant data forming the one bit data stored in the two individual cells of a pair of wordlines is sensed and restored so as to refresh the data. In order to perform the function of the two-cell-per-bit self-refresh, the pair of even and odd numbered wordlines is simultaneously activated as shown in FIG. 9. As the differential voltage levels represent the one bit data, the data retention time of two-cells can be longer than that of a single cell and thus, the refresh cycle of the two-cell-per-bit operation can be much less than that of the one-cell-per-bit operation. In the DRAM device according to the embodiment, therefore, the self-refresh is achieved with a longer self-refresh cycle, $P_{SRF}$, resulting in less power consumption. The simultaneous activation of a pair of wordlines is achieved by dual-row addressing performed by the row address decoder 253. The dual-row addressing is known technique and disclosed in U.S. Pat. No. 5,903,511 granted to Gillingham on May 11, 1999, which is incorporated herein by reference.

As seen in FIG. 7, it may happen that the last pulse of the self-refresh oscillation signal 231 is still active (i.e., the "high" logic state) when the first sleep signal 215 transitions from the "high" to "low" logic state at time T2. The falling transition of the first sleep signal 215 disables the self-refresh oscillation enable signal 227 and it may cause premature ceasing of the self-refresh oscillation signal 231. Therefore, with such a short period of time, the self-refresh oscillator 229 may be forced to cease the generation of the pulse. However, the short period of time may be insufficient for activating the wordline to properly restore the cell data. To prevent such a problem, the self-refresh oscillator 229 includes a protection circuit (not shown). By the protection circuit, once the self-refresh oscillator 229 generates a pulse, it can complete the generation of one pulse of the width $T_{OSCW}$, regardless of the state of the self-refresh oscillation enable signal 227. Also, the self-refresh entry/exit controller 217 detects the state of the self-refresh oscillation signal 231 by the latch circuit 340 thereof, to delay the generation of the self-refresh exit signal 241 until the "high" logic state of the self-refresh oscillation signal 231 ends (i.e., the transition from the "high" to "low" logic state). Then, the self-refresh exit signal 241 transitions from the "low" to "high" logic state and its rising transition initiates another burst refresh clock generation by the burst clock generator 243. Thereafter, operations similar to those of the "entry-burst refresh period" are repeated.

At the self-refresh exit, no pulse is produced for the dummy refresh signal 249 by the dummy refresh producer 221. In response to the rising transition of the self-refresh exit signal 241, the burst clock generator 243 generates pulses of the burst refresh clock signal 245 that are provided to the refresh clock producer 247. Also, the pulses (which correspond to pulses #1, #2, - - - ) are counted by the burst refresh counter 225. When the count reaches N, the burst refresh counter 225 disables the second sleep signal 223 to transition from the "high" to the "low" logic state. In response to the falling transition of the second sleep signal 223, the self-refresh exit signal 241 goes "low" at time T3. With the falling transition of the self-refresh exit signal 241, the pulse control signal 413 from the OR gate 411 of the burst clock producer 243 goes "low", with the result that burst pulse generator 415 ceases the generation of pulses of the burst refresh clock signal 245. Therefore, the refresh clock producer 247 ceases the generation of pulses of the refresh clock signal 251. The generation and ceasing of pulses of the burst refresh clock signal 245 establish another burst refresh cycle. This burst operation can be called an "exit-burst refresh period".

At time T2, the two-cell-per-bit row addressing operation is over and the operation mode returns to the sequential-row addressing operation mode. Thus, the operation of the "exit-burst refresh period" is based on the one-cell-per-bit operation and it is not necessary to start with even numbered wordlines. During the "exit-burst refresh period", the operation mode is prepared for the following normal mode to perform one-cell-per-bit write/read/refresh operations.

As described above, the latch circuit 320 of the self-refresh entry/exit controller 217 detects the address LSB signal "RFA[0]" 233 for the entry-burst refresh operation. Also, the latch circuit 340 is used for detection of the state of the self-refresh oscillation signal 231 to initiate the self-refresh exit signal 241 at the end of the self-refresh operation (or the self-refresh exit). In response to the falling transition of the first sleep signal "SLEEP1" 215 (time T2), the output signal of the NAND gate 331 goes "high". However, during the self-refresh oscillation signal "SREF_OSC" 231 is the "high" logic state, the rising transition of the output signal of the NAND gate 331 does not cause the NAND gate 341 of the latch circuit 340 change its logic state from the "high" to "low". When the self-refresh oscillation signal "SREF_OSC" 231 goes "low" (after time T2), the output of the NAND gate 343 of goes "high", with the result that output signal of the NAND gate 341 of the latch circuit 340 goes "low". Therefore, the output signal of the OR gate 345 goes "low", with the result that the self-refresh exit signal "EXIT" 241 goes "high". The "high" logic state of the self-refresh exit signal "EXIT" 241 is maintained until the burst refresh counter 225 counts N and the second sleep signal 223 is disabled (time T3).

Figure 11A:
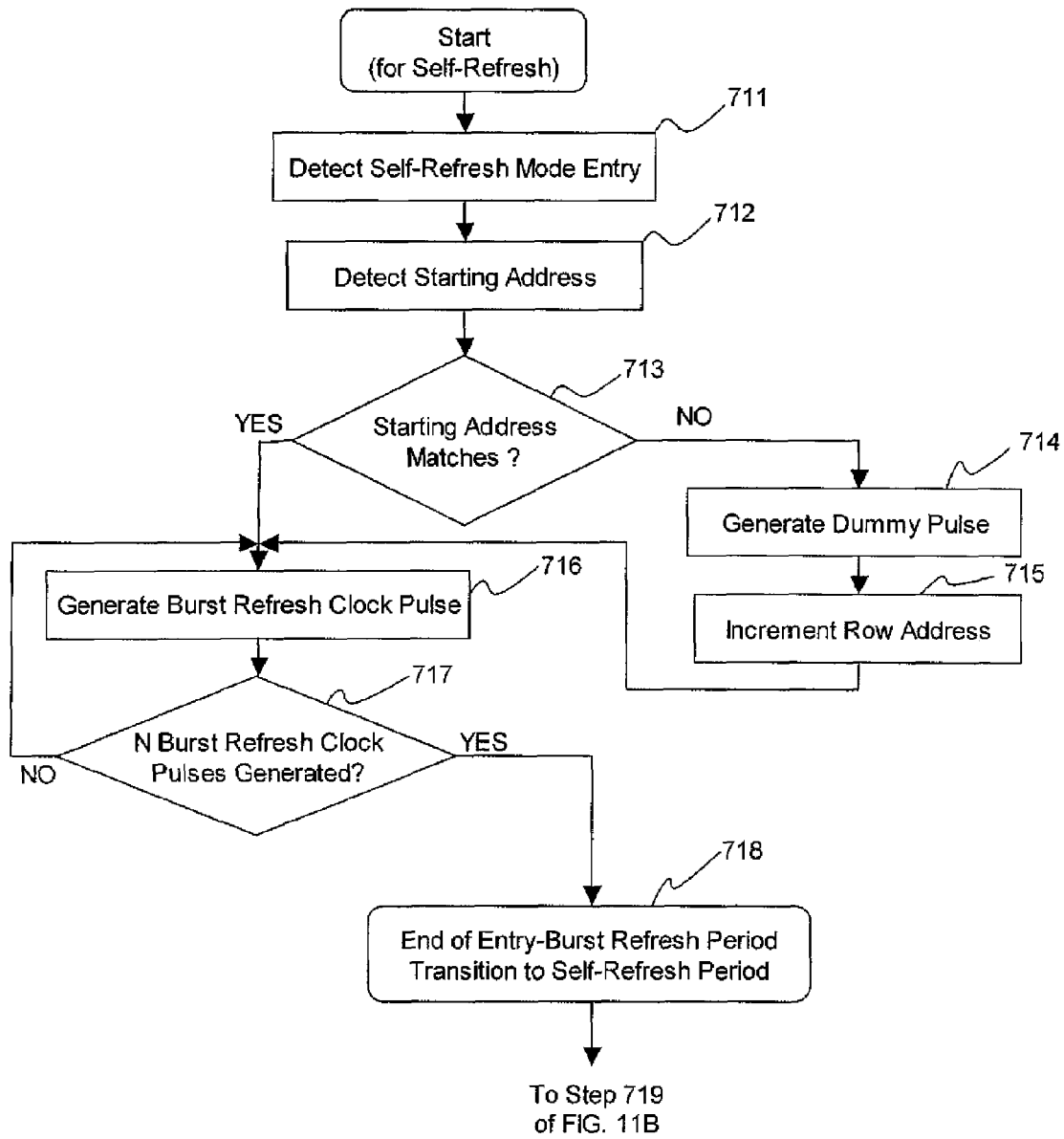
FIGS. 11A and 11B are flow charts illustrating the operation in the self-refresh mode performed by the DRAM device shown in FIG. 3.
Figure 11B:
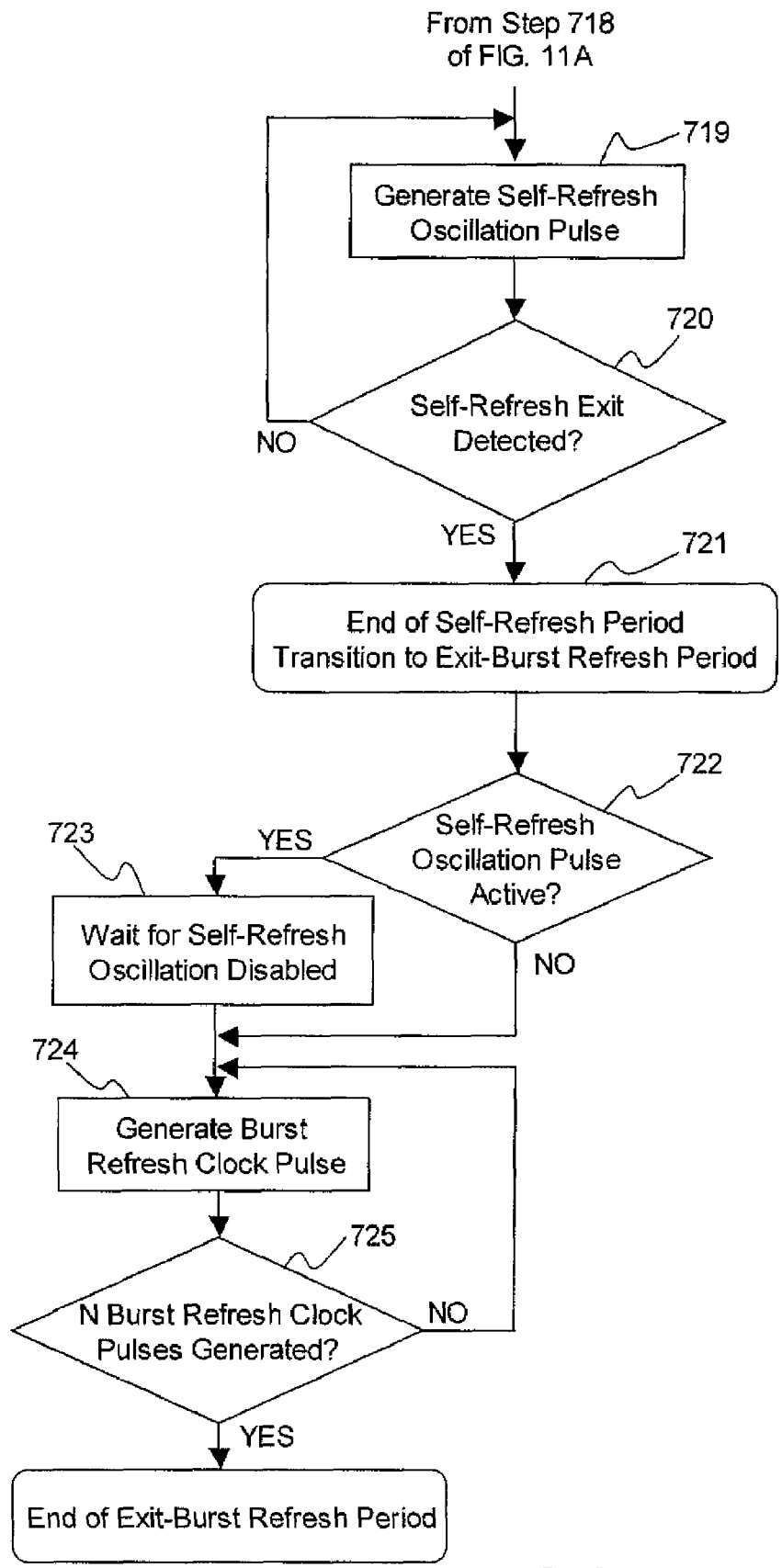

FIGS. 11A and 11B show the operations in the self-refresh mode by the DRAM device shown in FIG. 3. Referring to FIGS. 2-10, 11A and 11B, upon start of the control operation in the DRAM device, when the self-refresh mode detector 211 detects the entry into the self-refresh mode (step 711), the first sleep signal "SLEEP1" 215 is provided (i.e., enabled) (at time T0). In response to the first sleep signal "SLEEP1" 215, the operation mode is set to the row addressing mode. Before the self-refresh entry, the DRAM operates in the normal mode and the operation mode is the sequential-row addressing operation mode. Also, in response to the first sleep signal "SLEEP1" 215, the self-refresh entry/exit controller 217 starts the detection of the address for the entry-burst refresh operation. The self-refresh entry/exit controller 217 receives the row address signal and detects the address LSB signal "RFA[0]" 233 (step 712).

Then, the self-refresh entry/exit controller 217 determines whether the detected address matches with the predetermined address (step 713). In a case of no match (NO at step 713), then the dummy refresh producer 221 produces a dummy pulse (step 714) as the dummy refresh signal "DUM_REF" 249 and therefore, a dummy refresh cycle is established. In response to the dummy pulse, the refresh clock producer 247 provides pulse #0, which corresponds to the dummy pulse, to the internal row address counter 237. The internal row address counter 237 toggles to increment the row address (step 715). Where the detected address matches with the predetermined address (YES at step 713) or after the increment of the row address at step 715, the burst clock generator 243 generates a pulse as the burst refresh clock signal "BREF_ CLK" 245. It is noted that by establishing the dummy refresh cycle (step 714), the generation of burst refresh clock pulses is delayed. Thereafter, the burst refresh counter 225 determines whether the count by the burst refresh counter 225 reaches N (step 717). In a case where the count is not N (NO at step 717), the generation of burst refresh clock pulses continues (step 716). Once the count reaches N (YES at step 717), the entry-burst refresh period is over (time T1) and the operation moves to the self-refresh period (step 718). However, the row addressing operation continues.

In the row addressing operation during the entry-burst refresh period, at step 716, the even numbered wordline WLEV (e.g., wordline WL0) is activated and the cells ($MS_{0,0}$ to $MS_{0,M}$) connected thereto are refreshed, so that the cells are restored by the previously stored data (i.e., the main data). While the activated even numbered wordline WLEV is still active, its adjacent (odd numbered) wordline WLOD (e.g., wordline WL1) is activated and the cells ($MS_{1,0}$ to $MS_{1,M}$) connected thereto are written by the opposite data (i.e., the assistant data) to that of the even numbered wordline.

Then, the self-refresh oscillator 229 generates a pulse as the self-refresh oscillation signal "SREF_OSC" 231 (step 719). Thereafter, the self-refresh entry/exit controller 217 determines whether the exit from the self-refresh mode is detected (step 720). In a case of no detection of the self-refresh exit (NO at step 720), the generation of pulses of the self-refresh oscillation signal "SREF_OSC" 231 continues (step 719). Once the self-refresh exit is detected (YES at step 720), the first sleep signal "SLEEP1" 215 is disabled and the generation of pulses of the self-refresh oscillation is ceased (time T2). In response to the disabling of the first sleep signal 215, the operation mode is set to the sequential-row addressing operation mode. The self-refresh period is over and the operation moves to the exit-burst refresh period (step 721).

In the row addressing operation during the self-refresh period, at step 719, the even numbered wordline WLEV (e.g., wordline WL0) and the adjacent odd numbered wordline WLOD (e.g., wordline WL1) are simultaneously activated. Two cells (e.g., $MS_{0,0}$ and $MS_{1,0}$; $MS_{0,1}$ and $MS_{1,1}$; - - -, $MS_{0,M}$ and $MS_{1,M}$) between the two activated wordlines are refreshed by the previously stored main and assistant data that represent differential one bit data.

When the self-refresh period is over, the self-refresh entry/exit controller 217 determines whether the last pulse of the self-refresh oscillation signal "SREF_OSC" 231 is still active (i.e., the "high" logic state) (step 722). If active (YES), then the generation of the self-refresh exit signal "EXIT" 241 will be delayed until the self-refresh oscillation signal is disabled (step 723). After the self-refresh oscillation signal is non-active (NO at step 722 or step 723), the burst clock generator 243 generates a pulse as the burst refresh clock signal "BREF_ CLK" 245 (step 724). Then, the burst refresh counter 225 determines whether the count by the burst refresh counter 225 reaches N (step 725). In a case where the count is not N (NO at step 725), the generation of burst refresh clock pulses continues (step 724). Once the count reaches N (YES at step 725), the exit-burst refresh period is over (time T3).

In accordance with embodiments of the present invention implementing the two-cell-per-bit self-refresh operation, the power consumption of DRAM devices is reduced in the self-refresh operation mode. The data mapping in the embodiment DRAM device is, for example, that higher priority or important data is stored in the cells of the even numbered wordlines and lower priority or less important data is stored in the cells of the odd numbered wordlines. In the DRAM device for providing row addresses for self-refreshing DRAM according to the embodiment of the present invention, the correct initial set-up for the two-cell-per-bit self-refresh operation mode in the DRAM cell array is ensured. The device is able to detect the wrong start refresh address and provide the dummy refresh command to increment the internal row address counter.

Figure 12:
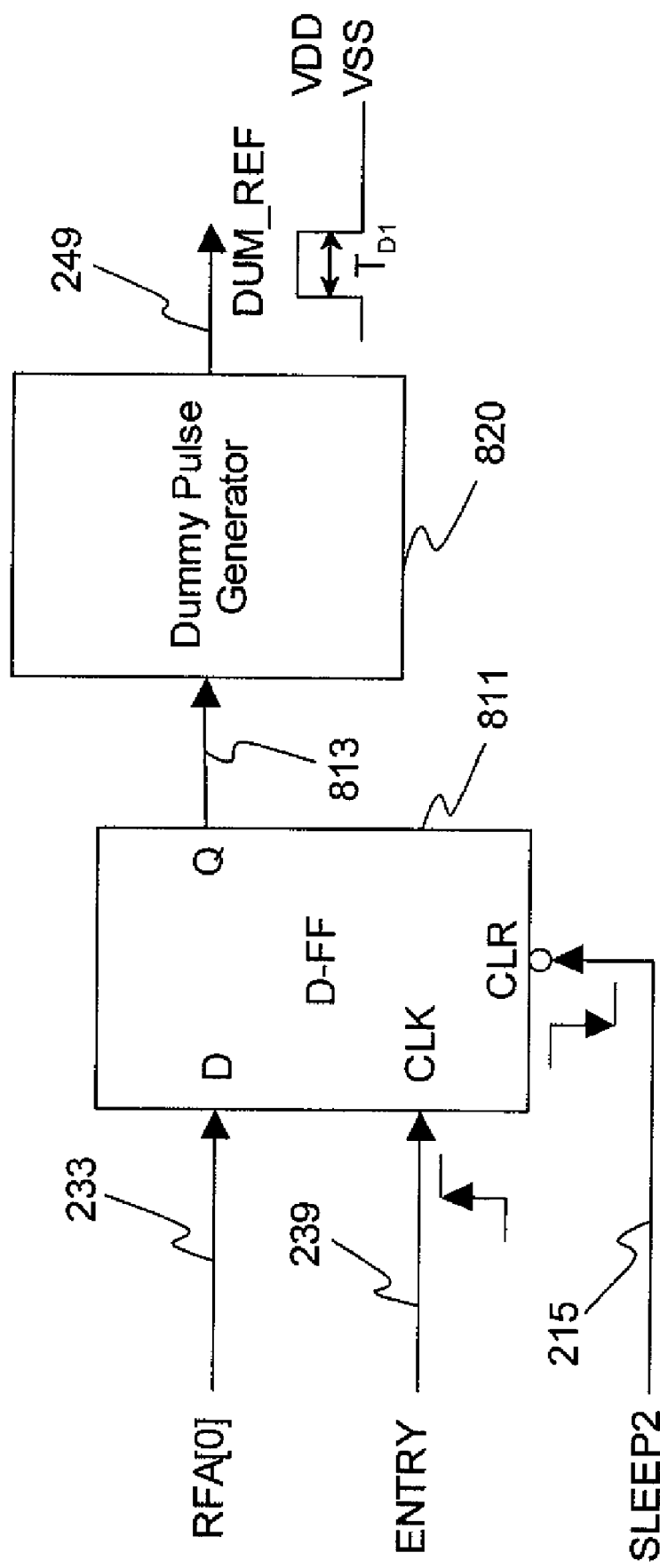
FIG. 12 is a block diagram illustrating another example of the dummy refresh producer of the DRAM device shown in FIG. 3.

FIG. 12 shows another example of the dummy refresh producer 221 shown in FIG. 3. Referring to FIG. 12, the address LSB signal "RFA[0]" 233, the first sleep signal "SLEEP1" 215 and the self-refresh entry signal 239 are fed to the D input terminal, the clock input terminal CLK and the clear input terminal CLR, respectively, of a D-type flip-flop 811. The output signal 813 of the Q output terminal of the flip-flop 811 is fed to a dummy pulse generator 820 which in turn produces pulses of the dummy refresh signal 249.

Referring to FIGS. 6 and 12, when the logic state of the address LSB signal "RFA[0]" 233 is "high", at the rising transition of the first sleep signal 215 as shown in FIG. 8, the Q output signal 813 of the D flip-flop 815 goes "high". In response to the rising transition of the Q output signal 817, the dummy pulse generator 820 generates a pulse having a predetermined width (e.g., width TD1) as the dummy refresh signal 249. Thereafter, in response to the falling transition of the self-refresh entry signal 239, the D flip-flop is reset. The dummy pulse generator 820 may be formed by a delay element and a logic gate as shown in FIG. 6.

Figure 13:
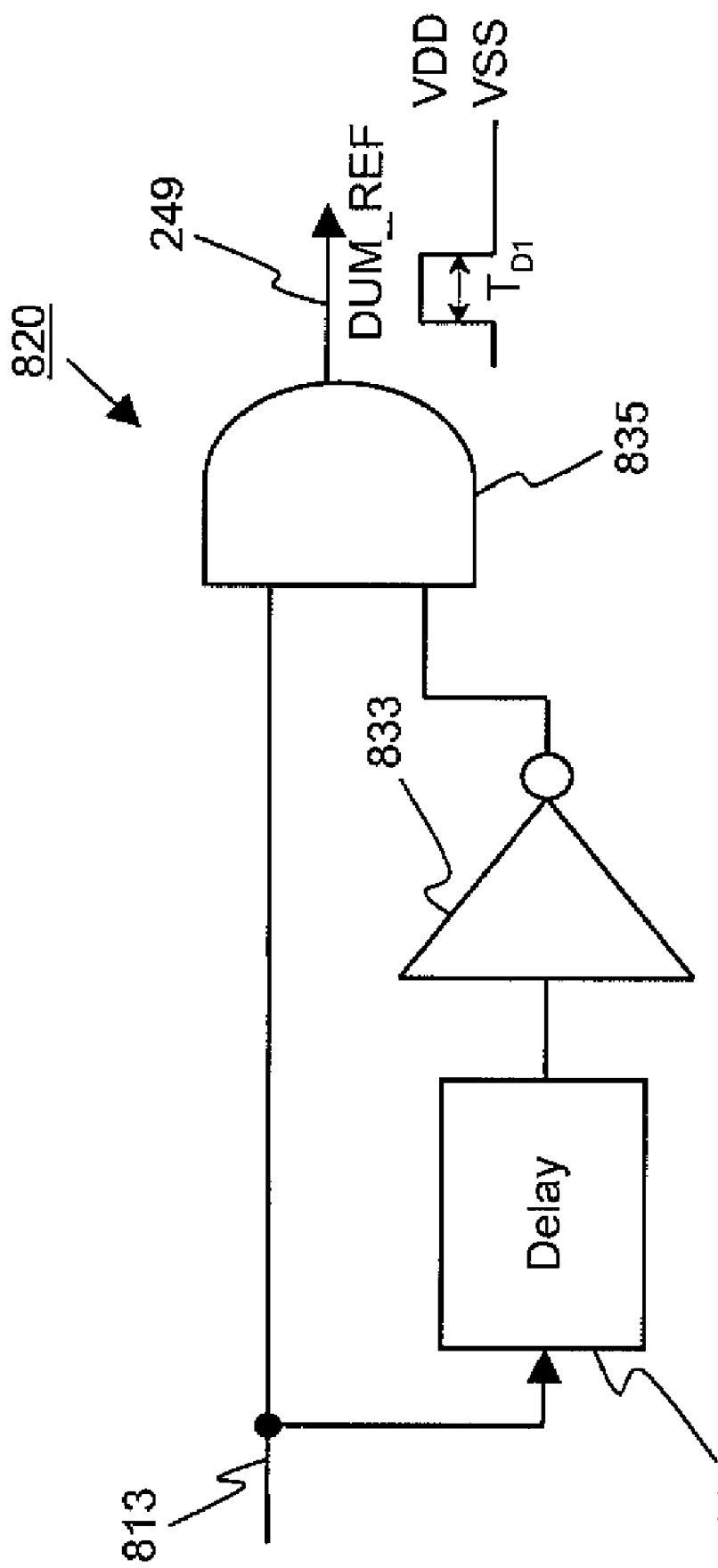
FIG. 13 is a block diagram illustrating an example of a dummy pulse generator of the dummy refresh producer shown in FIG. 12.

FIG. 13 shows an example of the dummy pulse generator 820 shown in FIG. 12. Referring to FIG. 12 and 13, the dummy pulse generator 820 is formed by a delay circuit 831, an inverter 833 and an AND gate 835. The output signal 817 from the D flip-flop 811 is fed to the AND gate 835 and the delay circuit 831. The delay circuit 831 delays the output signal 813 by a predetermined time (e.g., $T_{D1}$) and the delayed signal is inverted by the inverter 833. The inverted signal is fed to the AND gate 835. The AND gate 835 provides a pulse having a predetermined width (e.g., width $T_{D1}$) as the dummy refresh signal 249.

Figure 14:
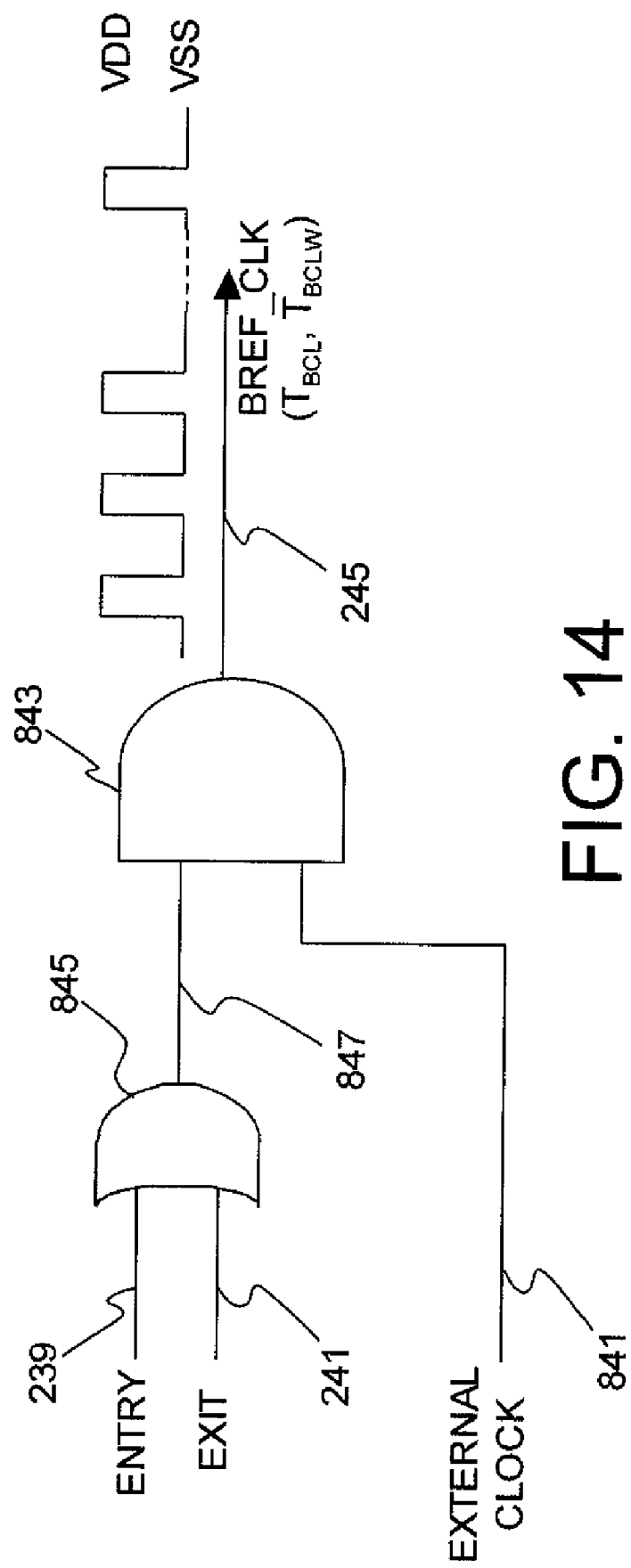
FIG. 14 is a block diagram illustrating another example of the burst clock generator of the DRAM device shown in FIG. 3.

In the embodiment DRAM device shown in FIG. 3, the burst clock generator 243 generates pulses of the burst refresh clock signal 245 upon receipt of the self-refresh entry signal 239 or the self-refresh exit signal 241. Instead of the internal burst clock generator, external clock pulses can be used as shown in FIG. 14. Referring to FIG. 14, an external clock signal 841 having continuous pulses from a clock source (not shown) is fed to one input terminal of an AND gate 843. The self-refresh entry signal 239 and the self-refresh exit signal 241 are fed to an OR gate 845 which in turn and provides its OR logic output signal 847 to another input terminal of the AND gate 843. The pulses of the external clock signal 841 are gated by the logic output signal 847, so that the gated clock pulses are provided as the burst refresh clock signal 245 during the "high" logic state of the self-refresh entry signal 239 or the self-refresh exit signal 241 (see FIG. 7).

Figure 15:
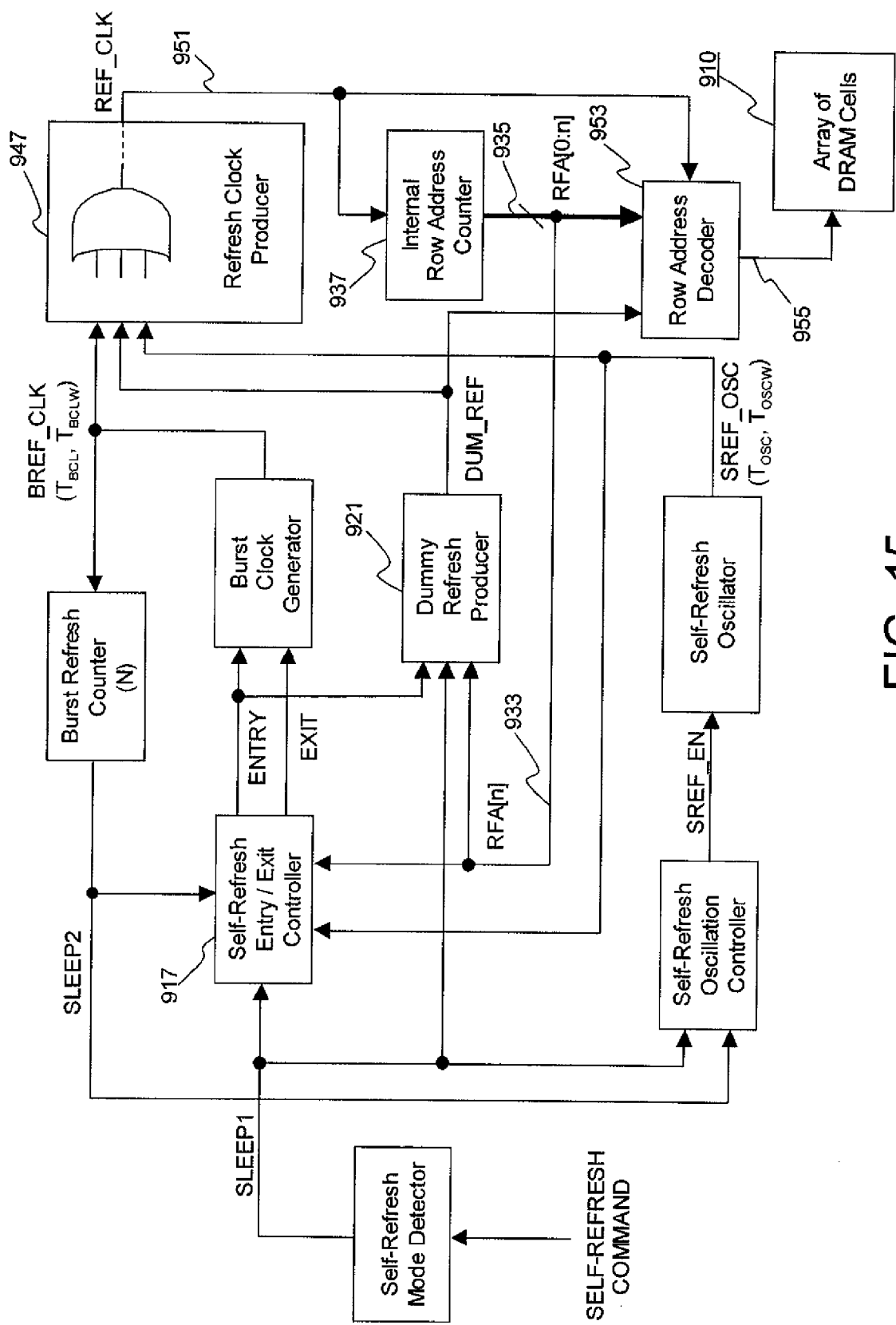
FIG. 15 is a block diagram of a DRAM device according to another embodiment of the present invention.

FIG. 15 shows a DRAM device according to another embodiment of the present invention. The embodiment DRAM device shown in FIG. 15 is similar to that of FIG. 3. In the DRAM device shown in FIG. 15, an array 910 of DRAM cells to be self-refreshed is arranged as the array 200 shown in FIG. 2. The row addressing for the self-refresh is performed to select from the highest row of wordline WL(N−1) to the lowest row of wordline WL0. Therefore, the row address to be detected for the two-cell-per-bit self-refresh is the most significant bit (MSB) "RFA[n]" of the refresh row address according to the DRAM array configuration. Referring to FIG. 15, a self-refresh entry/exit controller 917 and a dummy refresh producer 921 receive a one-bit address signal 933 representing one bit "RFA[n]" of a refresh row address signal 935 provided by an internal row address counter 937. The RFA[n] is provided to an R-S flip-flop type latch circuit included in the self-refresh entry/exit controller 917 and a NAND gate included in the dummy refresh producer 921. The circuitry of the self-refresh entry/exit controller 917 including the R-S flip-flop type latch is the same as that of the self-refresh entry/exit controller 217 as shown in FIG. 4. Similarly, the dummy refresh producer 921 including the NAND gate is the same as that of the dummy refresh producer 221 as shown in FIG. 6. Thus, the operation of detecting the starting address (the MSB) of the refresh row address is similar to the operation based on the LSB of the refresh row address as described above.

Furthermore, the embodiment DRAM device shown in FIG. 15 is different from that of FIG. 3. In the embodiment shown in FIG. 15, a refresh clock signal "REF_CLK" 951 from a refresh clock producer 947 is provided to a row address decoder 953 as well as an internal row address counter 937. The row address decoder 953 adjusts timing delays of signals and provides a decoded row address signal 955 to refresh the cells of the selected wordlines in the array 910 of DRAM cells.

The embodiments described above may have further various variations. In the above described embodiments, the signals are active "high" logic signals. The signals may, however, be active "low" logic signals, according to design preferences. The logic "high" and "low" states of the signals may be represented by the low and high supply voltages VSS and VDD, respectively. The pulse repetition period $T_{BCL}$ and pulse width $T_{BCLW}$ of the burst refresh clock signal 245 produced by the burst clock generator 243 are adjustable in accordance with the characteristics of the DRAM cell restore level. The pulse repetition period $T_{BCL}$ and the pulse width $T_{BCLW}$ may be dynamically varied. Similarly, the pulse repetition period $T_{OSC}$ and the pulse width $T_{OSCW}$ of the self-refresh oscillation signal 231 are adjustable. The pulse repetition period $T_{OSC}$ and the pulse width $T_{OSCW}$ may be dynamically varied. Also, the delay time $T_{D1}$ of the delay circuit 527 may be adjustable. The DRAM cell array may be set such as that the odd numbered wordlines are refreshed first in the self-refresh operation mode. In such a case, the LSB of the refresh row address RFA[0] should be the "high" logic state at the start of self-refresh and the detection of the wrong address should be modified accordingly. Similarly, the MSB of the refresh row address can be used for row addressing from the highest to lowest rows and in such a case, the modification of wrong address detection should be made, accordingly.

The DRAM device for providing row addresses and a DRAM array can be configured in a single device as a DRAM device. Also, the DRAM device and an array of DRAM cells which are self-refreshed by the addresses provided thereby may be configured in separate devices.

In the embodiments, the device elements and circuits are connected to each other as shown in the figures, for the sake of simplicity. In practical applications of the present invention to semiconductor ICs and DRAM devices, devices, elements, circuits, etc. may be connected directly to each other. As well, devices, elements, circuits etc. may be connected indirectly to each other through other devices, elements, circuits, etc., necessary for operation of the semiconductor ICs and DRAM devices. Thus, in actual configuration of semiconductor ICs and DRAM devices, the circuit elements and devices are coupled with (directly or indirectly connected to) each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A dynamic random access memory (DRAM) device comprising:
   an array of DRAM cells arranged in rows by columns, each DRAM cell of the array being coupled to a wordline of a corresponding row and a bitline of a corresponding column; and
   refresh circuitry for refreshing data stored in the DRAM cells coupled to wordlines of a first set of rows as main data and for overwriting assistant data into the DRAM cells coupled to wordlines of a second set of rows in a self-refresh mode, the assistant data being opposite data to the main data and each row of the second set being adjacent to each row of the first set, the refresh circuitry including
      a mode entry detector for detecting an entry into the self-refresh mode to retain the main data and to overwrite the assistant data, the mode entry detector producing a first self-refresh mode signal when entry into the self-refresh mode is detected,
      a refresh producer for detecting a starting refresh address provided by an address counter for operation of the self-refresh mode in response to the first self-refresh mode signal, the refresh producer changing the address counter when the detected starting refresh address mismatches a predetermined address.

2. The DRAM device of claim 1, wherein the refresh circuitry further comprises:
   an entry signal producer for producing a self-refresh entry signal in response to the first self-refresh mode signal; and
   adoption circuitry for adopting the dummy refresh cycle in the self-refresh mode.

3. The DRAM device of claim 2, wherein:
   the adoption circuitry comprises a burst circuit for determining a first burst refresh cycle in response to the self-refresh entry signal; and
   the refresh producer comprises a dummy circuit for determining a dummy refresh cycle in response to the first self-refresh mode signal and a row address signal, the dummy refresh cycle being executed when the starting refresh address mismatches the predetermined address.

4. The DRAM device of claim 3, wherein the adoption circuitry further comprises entry burst establishing circuitry for combining the dummy refresh cycle with the first burst refresh cycle to establish an entry-burst refresh period; and
   the burst circuit comprises
      a refresh burst generator for generating a first burst clock pulse signal during the first burst refresh cycle; and
      burst period decision circuitry for counting the burst clock pulses up to a predetermined value that corresponds to the number of the wordlines to produce a second self-refresh mode signal, the second self-refresh mode signal causing the self-refresh entry signal to be disabled and the first burst refresh cycle to be ceased.

5. The DRAM device of claim 4, wherein:
   the refresh circuitry further comprises an oscillator for establishing a self-refresh cycle in response to the second self-refresh mode signal; and
   the adoption circuitry further comprises a combiner for combining the self-refresh cycle with the entry-burst refresh period.

6. The DRAM device of claim 3, wherein the dummy circuit comprises:
   a pulse generator for generating a dummy pulse signal having a predetermined pulse width driven by the first self-refresh mode signal.

7. The DRAM device of claim 5, wherein the refresh circuitry further comprises:
   a mode exit detector for detecting an exit from the self-refresh mode to disable the first self-refresh mode signal; and
   an exit signal producer for producing a self-refresh exit signal in response to the first self-refresh mode signal being disabled.

8. The DRAM device of claim 7, wherein:
   the burst circuit further initiates a second burst refresh cycle in response to the self-refresh exit signal; and
   the combiner further combines the second burst refresh cycle with the self-refresh cycle with the entry-burst refresh period.

9. The DRAM device of claim 8, wherein the refresh burst generator further generates a second burst clock signal during the second burst refresh cycle.

10. The DRAM device of claim 9, wherein the adoption circuitry further comprises:
    a signal combiner for combining the dummy pulse signal, the first burst clock pulse signal, the oscillation pulse signal and the second burst clock signal to produce the refresh clock pulse signal for self-refreshing the cells.

11. The DRAM device of claim 10, wherein:
    the refresh burst generator comprises a pulse generator for generating pulses as the second burst clock pulse signal in response to the exit from the self-refresh mode; and
    the burst period decision circuitry comprises a pulse counter for counting the pulses of the burst clock pulse signal up to a predetermined value that corresponds to the number of the wordlines of the DRAM device, thereby producing the second self-refresh mode signal upon count of the predetermined value.

12. The DRAM device of claim 11, wherein the oscillator further comprises:
    an oscillation controller for controlling the generation of the oscillation pulse signal by the self-refresh oscillator in response to the first and second self-refresh mode signal.

13. The DRAM device of claim 12, wherein:
    the entry signal producer comprises first latch circuitry for holding the self-refresh entry signal when the generation of the first self-refresh mode signal and a given logic state of the row address signal overlap; and
    the exit signal producer comprises second latch circuitry for holding the self-refresh exit signal when the ceasing of the first self-refresh mode signal and the given logic state of the row address signal overlap.

14. The DRAM device of claim 13, wherein the dummy circuit comprises:
    third latch circuitry for disabling the generation of the dummy pulse signal when the row address signal matches the predetermined address.

15. The DRAM device of claim 1, wherein the refresh producer comprises:

a detector for detecting the starting refresh address based on one bit of the refresh row address represented by the refresh signal.

16. The DRAM device of claim 15, wherein the detector comprises:
one-bit detection circuitry for detecting a first address bit of the refresh signal for addressing a first row of the array.

17. A method for self-refreshing a dynamic random access memory (DRAM) having cells arranged in rows and columns, each DRAM cell of the array being coupled to a wordline of a corresponding row and a bitline of a corresponding column, the method comprising:
detecting an entry into a self-refresh mode for producing a first self-refresh mode signal;
detecting a starting refresh address provided by an address counter for operation of the self-refresh mode in response to the first self-refresh mode signal;
changing the address counter when the detected starting refresh address mismatches a predetermined address;
retaining data stored in the DRAM cells coupled to wordlines of a first set of rows, as main data when the detected starting refresh address matches the predetermined address; and
overwriting assistant data into the DRAM cells coupled to wordlines of a second set of rows, the assistant data being opposite data to the main data, each row of the second set being adjacent to each row of the first set.

18. The method of claim 17, wherein:
the step of retaining comprises rewriting the main data in the DRAM cells coupled to the word lines of even numbered rows; and
the step of overwriting comprises rewriting the assistant data in the DRAM cells coupled to the wordlines of odd numbered rows.

19. The DRAM device of claim 1, wherein changing the address counter includes incrementing the address counter when the detected starting refresh address mismatches the predetermined address.

20. The DRAM device of claim 1, wherein changing the address counter includes toggling the address counter when the detected starting refresh address mismatches the predetermined address.

21. The method of claim 17, wherein changing the address counter includes incrementing the address counter when the detected starting refresh address mismatches the predetermined address.

22. The method of claim 17, wherein changing the address counter includes toggling the address counter when the detected starting refresh address mismatches the predetermined address.

* * * * *